(12) United States Patent
Jang et al.

(10) Patent No.: US 7,935,600 B2
(45) Date of Patent: May 3, 2011

(54) METHOD OF MANUFACTURING MULTI-CHANNEL TRANSISTOR DEVICE AND MULTI-CHANNEL TRANSISTOR DEVICE MANUFACTURED USING THE METHOD

(75) Inventors: Se-myeong Jang, Anyang-si (KR); Woun-suck Yang, Suwon-si (KR); Min-sang Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/637,114

(22) Filed: Dec. 14, 2009

(65) Prior Publication Data

US 2010/0093146 A1    Apr. 15, 2010

Related U.S. Application Data

(62) Division of application No. 11/241,179, filed on Sep. 30, 2005, now Pat. No. 7,655,988.

(30) Foreign Application Priority Data

Oct. 2, 2004    (KR) .................. 10-2004-0078546

(51) Int. Cl.
    H01L 21/336    (2006.01)
(52) U.S. Cl. ........................... 438/283; 438/300
(58) Field of Classification Search .................. 438/283, 438/300
    See application file for complete search history.

(56) References Cited

U.S. PATENT DOCUMENTS

| 6,858,478 B2 | 2/2005 | Chau et al. |
| 7,060,539 B2 | 6/2006 | Chidambarrao et al. |
| 7,358,121 B2 | 4/2008 | Chau et al. |
| 2004/0036126 A1 | 2/2004 | Chau et al. |
| 2004/0036127 A1 | 2/2004 | Chau et al. |

FOREIGN PATENT DOCUMENTS

| KR | 20030065631 | 8/2003 |
| KR | 20030065864 | 8/2003 |

OTHER PUBLICATIONS

"Method of Manufacturing Multi-Channel Transistor Device and Multi-Channel Transistor Device Manufactured Using the Method" Specification, Drawings, and Prosecution History of U.S. Appl. No. 11/241,179, filed Sep. 30, 2005, by Se-myeong Jang, et al., which is stored in the United States Patent and Trademark Office (USPTO) Image File Wrapper (IFW) system.

*Primary Examiner* — Douglas M Menz
(74) *Attorney, Agent, or Firm* — Mills & Onello, LLP

(57) ABSTRACT

A multi-channel transistor device and a method of manufacturing the same are provided. The method of a manufacturing a multi-channel transistor device includes defining an active region in a semiconductor substrate by forming an isolation layer exposing an upper side portion of the active region. An active expanding region is formed on the exposed upper side portion of the active region by selective epitaxial growth (SEG). A portion of the active region is selectively etched to define first channel bars in the active expanding region that extend between first and second laterally separated portions of the active region and a second channel bar that is an unetched portion of the active region. A portion of the isolation layer is selectively removed such as to expose side portions of the second channel bar and bottom surface portions of the first channel bars. A gate is formed on the first and second channel bars with a gate dielectric layer between the gate and the channel bars. A source/drain region is formed in a region of the active expanding region adjacent to the gate, thereby resulting in a multi-channel transistor structure.

20 Claims, 25 Drawing Sheets

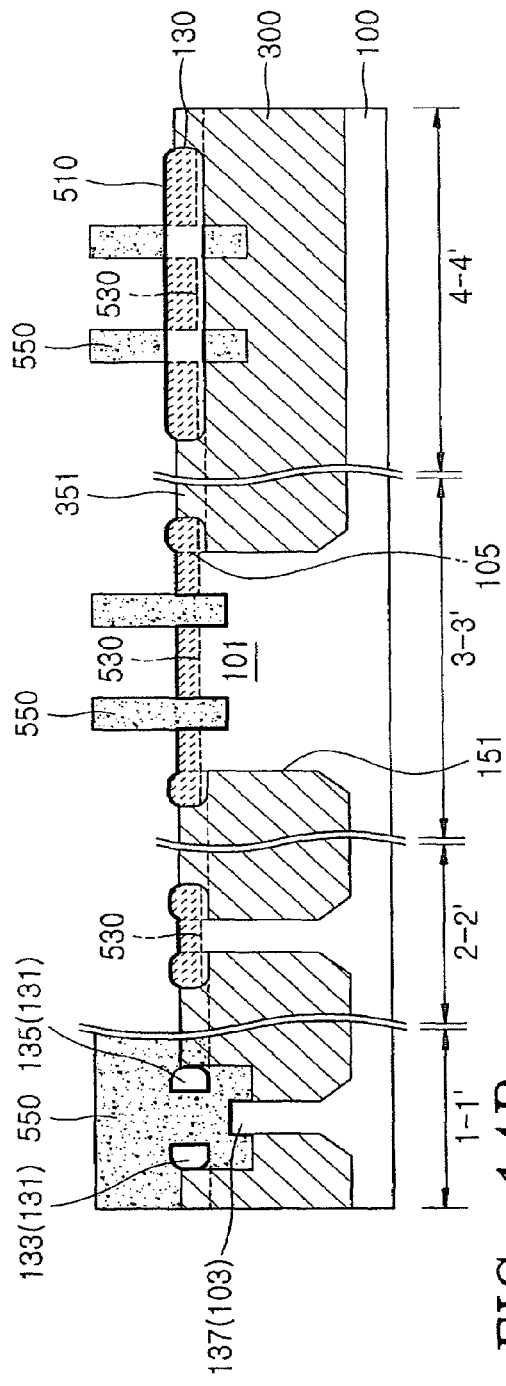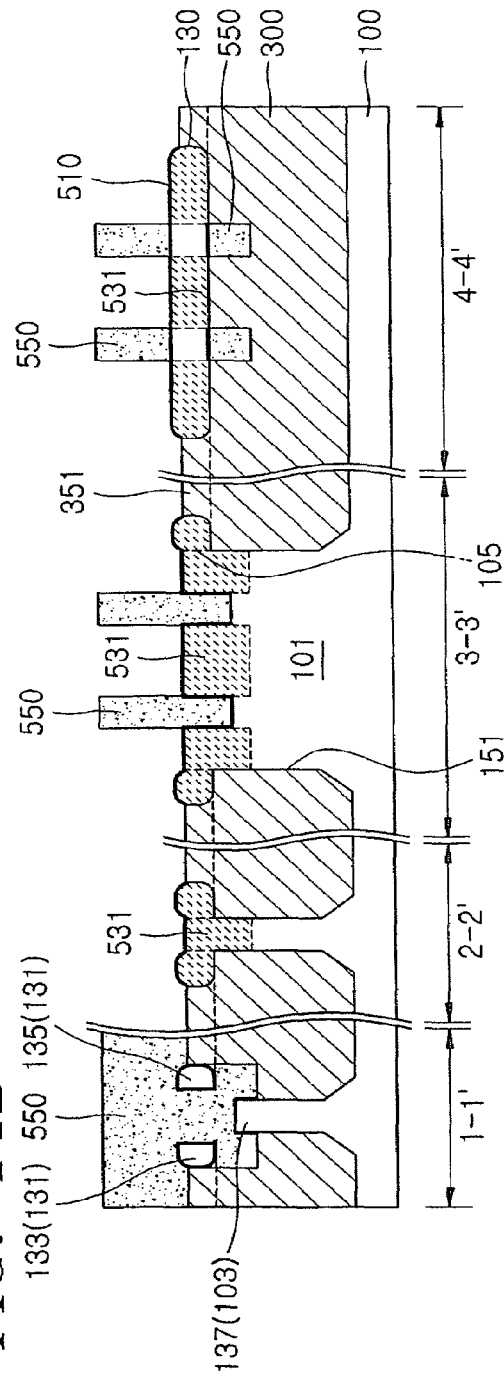

METHOD OF MANUFACTURING MULTI-CHANNEL TRANSISTOR DEVICE AND MULTI-CHANNEL TRANSISTOR DEVICE MANUFACTURED USING THE METHOD

RELATED APPLICATIONS

This application is a divisional of U.S. application Ser. No. 11/241,179, filed on Sep. 30, 2005, which relies for priority upon Korean Patent Application No. 10-2004-0078546, filed on Oct. 2, 2004, the contents of which are herein incorporated by reference in their entirety.

1. FIELD OF THE INVENTION

The present invention relates to a semiconductor device, and more particularly, to a method of manufacturing a multi-channel transistor device and a multi-channel transistor manufactured by the method.

2. DESCRIPTION OF THE RELATED ART

As the degree of integration of semiconductor devices, particularly, memory devices, has increased and the design rule has greatly decreased, the available area for forming an active region for a device greatly decreases. As a result, it becomes more difficult to ensure a sufficient length or width for a transistor formed in the active region.

As the channel length of a transistor such as an MOSFET decreases, a short channel effect becomes predominant and adversely affects the characteristics of the transistor. A small active region leads to a small gate length in a transistor, thereby deteriorating the characteristics of the transistor due to punch-through. With reduction in the width of the transistor, current capability $I_d$, which is proportional to the width of the transistor and is inversely proportional to the length, expressed as $I_d \propto W/L$, decreases, thereby deteriorating the current characteristics of the device. For these reasons, many suggestions for effectively ensuring a longer effective channel length for a transistor formed in a limited active region have been raised.

One of these suggestions is to form a multi-channel MOSFET, which has a plurality of bar-shaped channels. Multi-channel transistors can have a variety structures but also have limitations to be considered.

In addition, leakage current characteristics, which are affected by a P-N junction formed in the source/drain region of a cell transistor, are problems arising with a reduction in the design rule of semiconductor devices. Leakage current is an important factor as it results in a direct deterioration in transistor characteristics, especially refresh characteristics, of a dynamic random access memory (DRAM). As a solution to the problems arising with leakage current, a device structure with an oxide junction below an active region in a cell area has been suggested.

Along with the suggestion of such a promising device structure, and as methods of manufacturing the same have been suggested, research into a memory cell transistor having a new structure and a method of effectively manufacturing the memory cell transistor is continuing.

SUMMARY OF THE INVENTION

The present invention is directed to a method of manufacturing a multi-channel transistor device by which a sufficient channel length is ensured to the transistor despite a corresponding small design rule and associated problems including current capability and refresh characteristics. The present invention is further directed to a multi-channel transistor device manufactured using the method.

In one aspect, the present invention is directed to a method of manufacturing a multi-channel transistor device, the method comprising; defining an active region in a semiconductor substrate by forming a first isolation layer exposing an upper side portion of the active region; forming an active expanding region on the exposed upper side portion of the active region by selective epitaxial growth (SEG); forming on the first isolation layer a second isolation layer that separates adjacent active expanding regions; selectively etching a portion of the active region to define channel bars in the active expanding region that extend between first and second laterally separated portions of the active region; selectively removing a portion of the first isolation layer that contacts bottom surface portions of the channel bars such as to expose the bottom surface portions of the channel bars; forming a gate dielectric layer on exposed surfaces of the channel bars; forming a gate on the gate dielectric layer; and forming a source/drain region in a region of the active expanding region adjacent to the gate.

In one embodiment, the selectively etching of the portion of the active region to define the channel bars, the active region is etched to a level that is lower than the bottoms of the channel bars such that portions of the first isolation layer that are in contact with the bottom surface portions of the channel bars are exposed.

In another embodiment, the selectively removing the portion of the first isolation layer comprises recessing side portions of the first isolation layer that are exposed by etching the active region.

In another embodiment, the method further comprises selectively removing portions of the second isolation layer that remain on both sides of the channel bars to expose all sides of the channel bars after the selectively removing of the first isolation layer.

In another embodiment, the gate surrounds all the exposed sides of the channel bars.

In another embodiment, the method further comprises annealing the channel bars in a hydrogen-containing atmosphere before the forming of the gate dielectric layer.

In another embodiment, the source/drain region forms a junction with the first isolation layer underlying the active expanding region.

In another embodiment, the source/drain region extends to the active region adjacent to the active expanding region.

In another aspect, the present invention is directed to a method of manufacturing a multi-channel transistor device, the method comprising: defining an active region in a semiconductor substrate by forming a first isolation layer exposing an upper side portion of the active region; forming an active expanding region on the exposed upper side portion of the active region by selective epitaxial growth (SEG); forming on the first isolation layer a second isolation layer that separates adjacent active expanding regions; selectively etching a portion of the active region to define first channel bars in the active expanding region that extend between first and second laterally separated portions of the active region; selectively removing a portion of the first isolation layer that contacts bottom surface portions of the channel bars such as to expose the bottom surface portions of the first channel bars and a portion of the active region that operates as a second channel bar; forming a gate dielectric layer on exposed surfaces of the first and second channel bars; and forming a source/drain region in a region of the active expanding region adjacent to the gate.

In one embodiment, the selectively removing the portion of the first isolation layer comprises recessing the first isolation layer that has been selectively removed such as to expose the bottom surface portions of the first channel bars and to form the second channel bar.

In another embodiment, the method further comprises exposing all sides of the first channel bars by selectively removing portions of the second isolation layer that remain on both sides of the first channel bars after the selectively removing of the first isolation layer.

In another embodiment, the gate surrounds all the exposed sides of the first channel bars and contacts the second channel bar.

In another embodiment, the method further comprises annealing the first and second channel bars in a hydrogen-containing atmosphere before the forming of the gate dielectric layer.

In another embodiment, the gate forms a twin structure with another gate that shares the source/drain region with said gate.

In another embodiment, the source/drain region forms a junction with the first isolation layer underlying the active expanding region.

In another embodiment, the source/drain region extends to the active region adjacent to the active expanding region.

In another embodiment, the source/drain region extends toward the active region to a depth level with an upper surface of the second channel bar.

In another embodiment, the first channel bars are positioned to face each other at the same level to form a triangular structure together with the second channel bar.

In another aspect, the present invention is directed to a method of manufacturing a multi-channel transistor device, the method comprising; forming on a semiconductor substrate an active mask that selectively exposes an active region; forming a trench for isolation by selectively etching a portion of the semiconductor substrate that is selectively exposed by the active mask; forming a first isolation layer partially filling the trench and exposing a sidewall portion of the trench that corresponds to an upper side portion of the active region; forming an active expanding region on the exposed upper side portion of the active region by selective epitaxial growth (SEG); forming a second isolation layer that separates adjacent active expanding regions; forming an active mask second pattern covering a portion of the active region; forming an etch mask by forming an etch mask layer over the active mask second pattern, wherein the etch mask layer and a residual second isolation layer, which is a portion of the second isolation layer that remain unetched, cooperatively operate as the etch mask; selectively removing the active mask second pattern using the etch mask; selectively etching a portion of the active region that is exposed as a result of removing the active mask second pattern to form a groove that separates channel bars defined in the active expanding region from the active region; selectively removing a portion of the first isolation layer that is exposed by the groove and underlies the channel bars such that a sidewall of the groove is recessed and exposes at least the bottom surface portions of the channel bars and removing the etch mask; forming a gate dielectric layer on exposed surfaces of the channel bars; forming a gate on the gate dielectric layer; and forming a source/drain region in a region of the active expanding region adjacent to the gate.

In one embodiment, the method further comprises recessing a sidewall of the trench such that the active mask overhangs the trench before the forming of the first isolation layer.

In another embodiment, the method further comprises forming a spacer on the sidewall of the trench.

In another embodiment, the forming of the first isolation layer comprises: forming an insulating material layer by filling the trench with an insulating material that has an etching selectivity with respect to the active mask; performing chemical mechanical polishing on the insulating material layer until a top surface of the active mask is exposed; and selectively etching the polished insulating material layer using the active mask as an etch mask such that the upper side portion of the active region is exposed.

In another embodiment, a thickness of the active expanding region is determined according to the height of the exposed upper side portion of the active region.

In another embodiment, the forming of the active mask second pattern comprises: forming a dummy gate pattern across the second isolation layer and the active mask; and selectively etching a portion of the active mask and a portion of the second isolation layer that are exposed by the dummy gate pattern such that a surface of the underlying expended active portion is partially exposed.

In another embodiment, the forming of the etch mask comprises: forming the etch mask layer by depositing an insulating material that has an etching selectivity with respect to the active mask second pattern over the active mask second pattern to fill the etched portion of the second isolation layer; and performing chemical mechanical polishing on the etch mask layer using the active mask second pattern as a polishing end point, wherein the polished etch mask layer and the residual second isolation layer form the etch mask.

In another embodiment, the method further comprises exposing all sides of the channel bars by selectively removing portions of the second isolation layer that remain on both sides of the channel bars after the selectively removing of the first isolation layer.

In another embodiment, the exposing of all the sides of the channel bars comprises selectively removing the portions of the second isolation layer that remain on both sides of the channel bars using a reverse gate mask pattern as an etch mask.

In another embodiment, the exposing of all the sides of the channel bars comprises: forming a sacrificial layer shielding an entrance of the groove; forming the reverse gate mask pattern on the sacrificial layer; selectively etching away the sacrificial layer and the portions of the second isolation layer using the reverse gate mask pattern as the etch mask; and selectively removing the reverse gate mask pattern.

In another embodiment, the gate surrounds all the exposed sides of the channel bars.

In another embodiment, the method further comprises annealing the channel bars in a hydrogen-containing atmosphere before the forming of the gate dielectric layer.

In another aspect, the present invention is directed to a method of manufacturing a multi-channel transistor device, the method comprising; forming on a semiconductor substrate an active mask that selectively exposes an active region; forming a trench for isolation by selectively etching a portion of the semiconductor substrate that is selectively exposed by the active mask; forming a first isolation layer partially filling the trench and exposing a sidewall portion of the trench that corresponds to an upper side portion of the active region; forming an active expanding region on the exposed upper side portion of the active region by selective epitaxial growth (SEG); forming a second isolation layer that separates adjacent active expanding regions; forming an active mask second pattern covering a portion of the active region from the active mask; forming an etch mask by forming an etch mask layer over the active mask second pattern, wherein the etch mask layer and a residual second isolation layer, which is a portion of the second isolation layer that remain unetched, cooperatively operate as the etch mask; selectively removing the active mask second pattern using the etch mask; selectively etching a portion of the active region that is exposed as a result of removing the active mask second pattern to form a groove that separates first channel bars defined in the active expanding region from the active region and exposes a top surface of a second channel bar that is an unetched portion of the active region; selectively removing a portion of the first isolation layer that is exposed by the groove and underlies the first channel bars such that a sidewall of the groove is recessed and exposes at least the bottom surface portions of the first channel bars and side portions of the second channel bar and removing the etch mask; forming a gate dielectric layer on exposed surfaces of the first and second channel bars; and forming a gate on the gate dielectric layer; and forming a source/drain region in a region of the active expanding region adjacent to the gate.

In one embodiment, the method further comprises exposing all sides of the first channel bars by selectively removing portions of the second isolation layer that remain on both sides of the first channel bars after the selectively removing of the first isolation layer.

In another embodiment, the exposing of all the sides of the first channel bars comprises selectively removing the portions of the second isolation layer that remain on both sides of the channel bars using a reverse gate mask pattern as an etch mask.

In another embodiment, the exposing of all the sides of the first channel bars comprises: forming a sacrificial layer shielding an entrance of the groove; forming the reverse gate mask pattern on the sacrificial layer; selectively etching away the sacrificial layer and the portions of the second isolation layer using the reverse gate mask pattern as the etch mask; and selectively removing the reverse gate mask pattern.

In another embodiment, the gate surrounds all the exposed sides of the first channel bars and contacts the second channel bar.

In another aspect, the present invention is directed to a multi-channel transistor device comprising: two active regions that are in the shape of laterally spaced mesa structures formed on a substrate; active expanding regions extending outwardly from opposing upper side portions of the two active regions, not extending between portions of the two active regions that face each other, and extending laterally to connect the upper side portions of the two active regions; a gate covering channel bars that are defined as a portion of the active expanding regions that connect the active regions, with a gate dielectric layer between the gate and the channel bars; and a source/drain region formed in a region of each of the active expanding regions adjacent to the gate.

In one embodiment, the active expanding regions are semiconductor layers formed by selective epitaxial growing (SEG).

In another embodiment, the source/drain region in each of the active expanding regions extends toward a corresponding active region.

In another embodiment, the source/drain region has a depth that is at least equal to a thickness of the active expanding region.

In another embodiment, the gate surrounds the channel bars.

In another embodiment, the gate contacts all the sides of the channel bars except for outer opposed side faces of the channel bars.

In another embodiment, the device further comprises a second channel bar that is a protruding portion of the substrate and connects the active regions.

In another embodiment, the source/drain region extends toward the active region adjacent to the gate to a depth at which the second channel bar is located.

In another embodiment, the second channel bar is positioned such as to form a triangular structure with the two first channel bars.

In another aspect, the present invention is directed to a multi-channel transistor device comprising: three active regions in the shape of laterally spaced mesa structures in a line on a substrate; active expanding regions extending outwardly from both opposing upper side portions of each of the active regions, not extending between portions of the active regions that face each other, and extending laterally to connect upper side portions of the active regions; two gates formed parallel to each other to cover channel bars that are defined as a portion of the active expanding regions that connect the active regions, with a gate dielectric layer between the gates and the channel bars; and a source/drain region formed in a region of each of the active expanding regions adjacent to the gate.

In another aspect, the present invention is directed to a multi-channel transistor device comprising: two active regions that in the shape of laterally spaced mesa structures formed in a line on a substrate; active expanding regions extending outwardly from opposing upper side portions of the two active regions, not extending between portions of the two active regions that face each other, and extending laterally to connect the upper side portions of the two active regions; a gate covering channel bars that are defined as a portion of the active expanding regions that connect the active regions, with a gate dielectric layer between the gate and the channel bars; a source/drain region formed in a region of each of the active expanding regions adjacent to the gate; and an isolation layer that contacts a lower portion and a side portion of the region of each of the active expanding regions in which the source/drain region is formed.

In one embodiment, the isolation layer extends such as to contact side portions of the channel bars that do not face each other.

In another embodiment, the isolation layer is separated from the channel bars such as to expose all sides of the channel bars.

In another embodiment, the gate surrounds the channel bars that are completely separated from the isolation layer.

In another embodiment, the device further comprises a second channel bar that is a protruding portion of the substrate and connects the active regions.

In another aspect, the present invention is directed to a method of manufacturing a multi-channel transistor device, the method comprising: forming an active pattern comprising: two active regions that are in the shape of laterally shaped mesa structures formed on a substrate; active expanding regions extending outwardly from opposing upper side portions of the two active regions that do not face each other, not extending between portions of the two active regions that face each other, and extending laterally to connect the upper side portions of the active regions the active regions; first channel bars that are defined as a portion of the active expanding regions that connect the active regions; and a second channel bar that is a protruding portion of the substrate and connects the two active regions; forming a gate with a gate dielectric layer between the gate and the first and second channel bars; and forming a source/drain region in a region of each of the active expanding regions adjacent to the gate.

BRIEF DESCRIPTION OF THE DRAWINGS

The above and other features and advantages of the present invention will become more apparent by describing in detail exemplary embodiments thereof with reference to the attached drawings in which:

FIG. 14A is a sectional view for explaining a process of forming a source/drain region in an active expanding region according to an embodiment of the present invention;

FIG. 14B is a sectional view for explaining a process of forming a source/drain region that is deep enough to contact a lower channel bar according to an embodiment of the present invention;

DETAILED DESCRIPTION OF THE INVENTION

The present invention will be described more fully with reference to the accompanying drawings, in which exemplary embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art.

In embodiments of the present invention, solutions to the problems relating to the amount of current and refreshing in a cell transistor arising due to an increase in the degree of integration of a memory semiconductor device and a reduction in design rule are provided. In the embodiments of the present invention, techniques of forming at least two bar-shaped channels by selective epitaxial growth (SEG) or selective etching using a mask defining an active region are suggested.

First, a field region in which an active region will be defined is delimited, and a gap-filling process of the shallow trench isolation (STI) type is performed. Next, an upper sidewall of the active region is selectively exposed, and SEG is performed thereon to expand an upper portion of the active region.

As a result, an effect of increasing the area of a self aligned contact (SAC), which will be formed in a subsequent process, is obtained. In addition, the active region is selectively etched using a mask to partially or fully expose the side and/or bottom surface of a portion formed by SEG. The SEG portion can be used as one of multiple bar-shaped channels for a multi-channel transistor structure or a multi-channel fin structure. As a result, the cell transistor has increased current capability.

In addition, by forming a spacer below the expanded portion of the active region, occurrence of a void when filling a trench with an insulating material for STI can be prevented. In addition, since an oxide or insulator junction can be located below the active region, a self-defined junction partially insulated FET (PI-FET) can be constructed. As a result, junction leakage can be suppressed, and refresh characteristics can be improved due to a reduction in junction leakage.

FIGS. 1A through 11C are views for explaining processes of forming bar-shaped channels for a multi-channel transistor according to embodiments of the present invention.

Figure 1A:
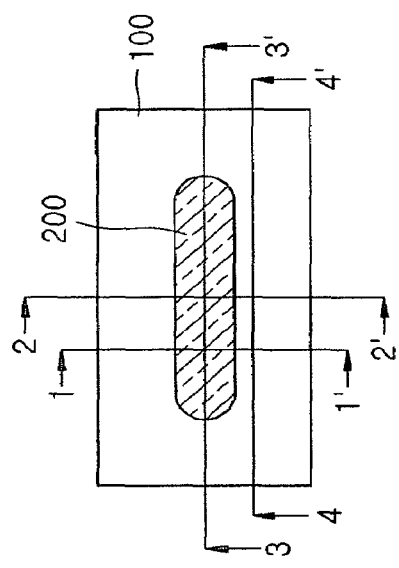
FIGS. 1A, 1B, and 1C are a plane view, a sectional view, and a perspective view, respectively, for explaining the formation of a trench for device isolation in a semiconductor substrate according to an embodiment of the present invention.
Figure 1B:
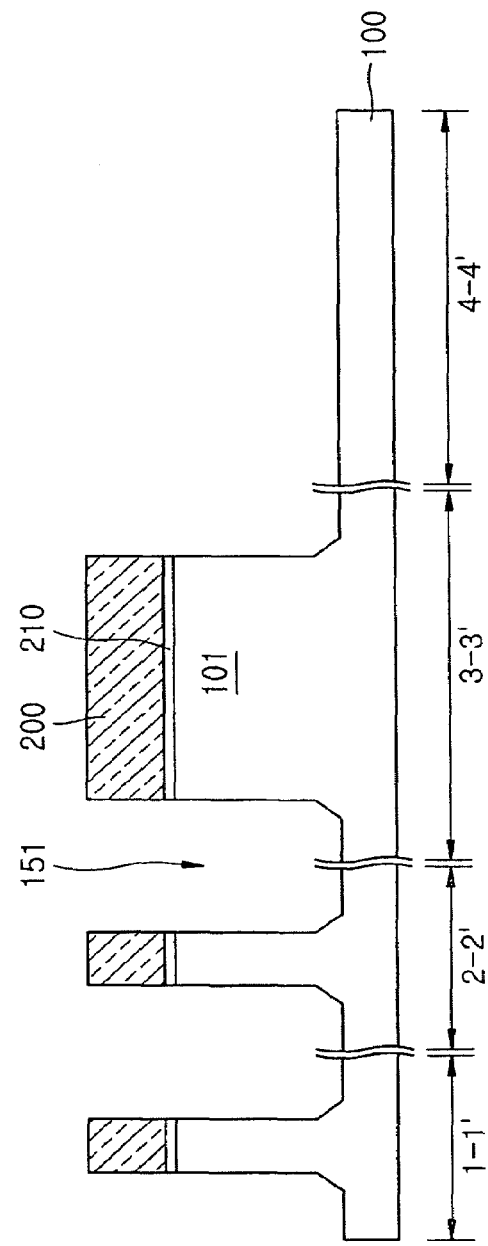
Figure 1C:
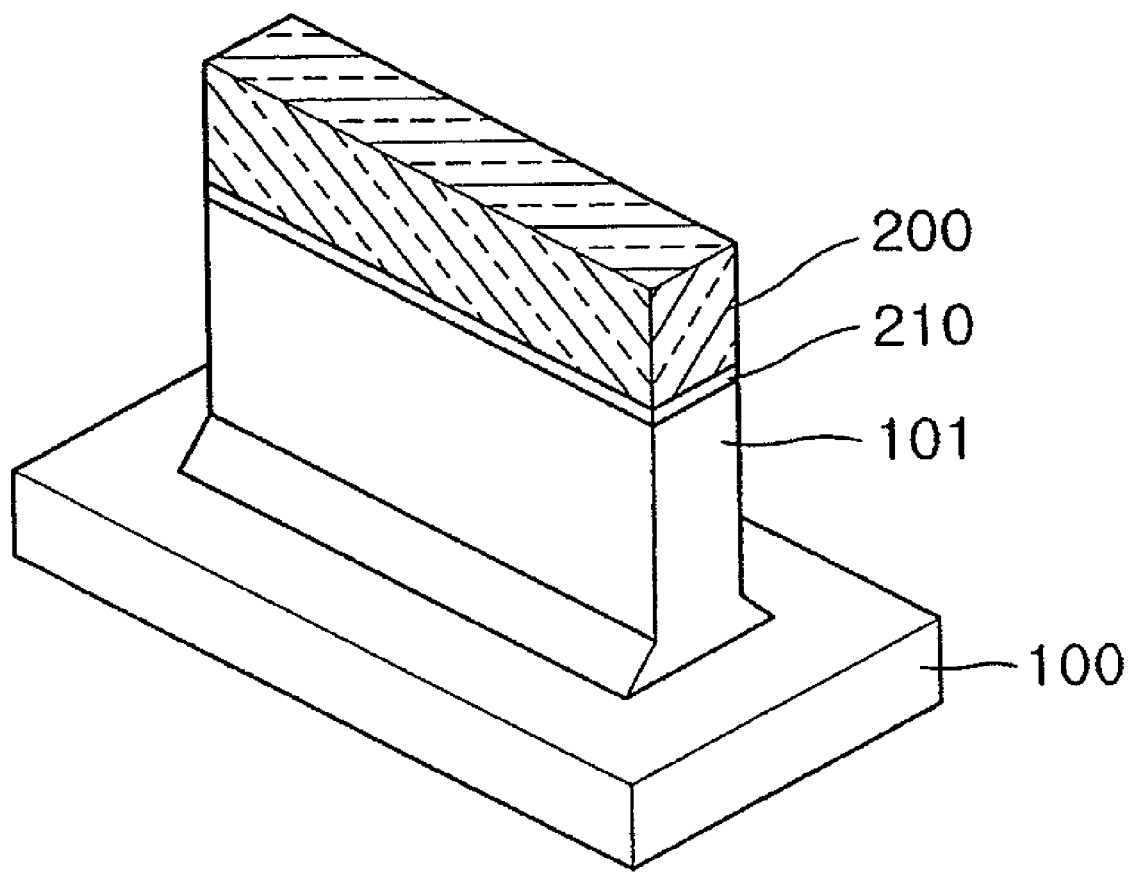

FIGS. 1A, 1B, and 1C are views for explaining the formation of a trench 151 for device isolation in a semiconductor substrate 100. FIG. 1A is a plane view of a mask 200 used to form the trench 151. In particular, the mask 200 is an active mask used to define an active region 101. FIG. 1B shows sectional views taken along line 1-1', line 2-2', line 3-3', and line 4-4' of FIG. 1A. FIG. 1C is a perspective view illustrating the active region 101.

Referring to FIGS. 1A, 1B, and 1C, the active mask 200, which selectively defines the active region 101 and exposes a field region, is positioned on the semiconductor substrate 100. The active mask 200 may be formed of an insulating material having an etching selectivity with respect to the semiconductor substrate 100, which is formed of silicon. For example, the active mask 200 may include a silicon nitride ($Si_3N_4$) layer. In this case, a pad oxide layer 210 operating as a sacrificial oxide layer can be formed below the silicon nitride layer prior to the formation of the silicon nitride layer.

According to typical STI processes, a portion of the semiconductor substrate 100 that is exposed by the active mask 200 is selectively etched to form the trench 151, which is to be filled with an insulating material, in the field region. The selective etching process can be a dry etching process. As a result, a pattern of the active region 101 is formed.

Figure 2A:
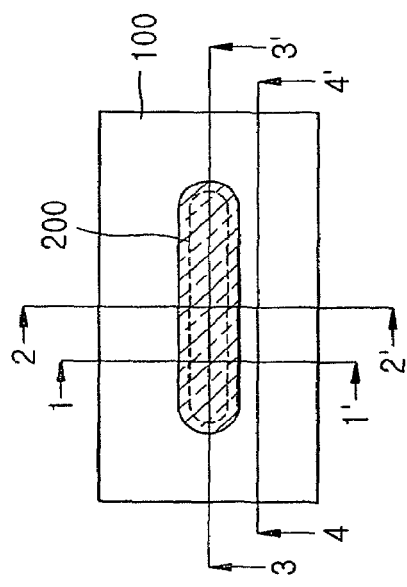
FIGS. 2A, 2B, and 2C are a plane view, a sectional view, and a perspective view, respectively, for explaining a process of recessing the active region according to an embodiment of the present invention.
Figure 2B:
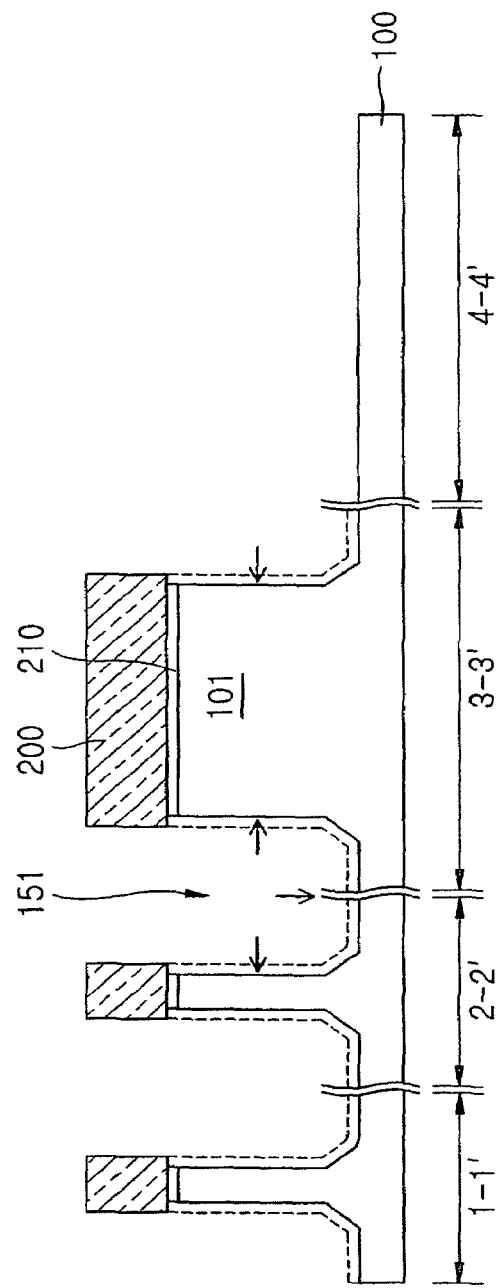
Figure 2C:
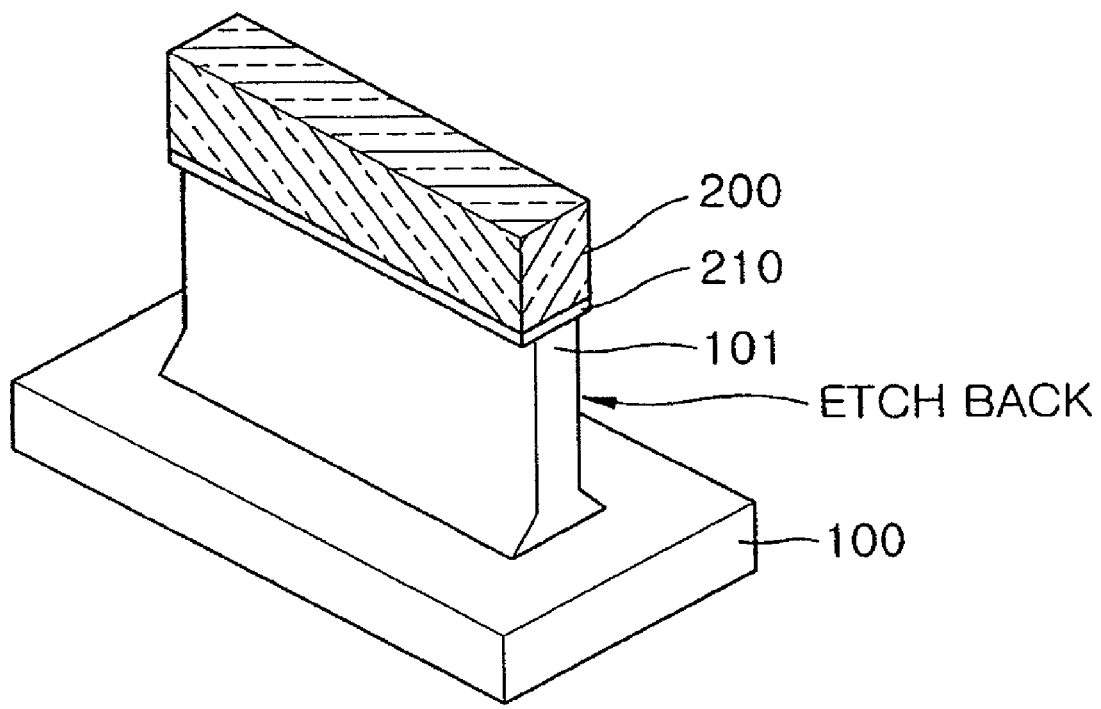

FIGS. 2A, 2B, and 2C are views for explaining a process of recessing the active region 101. In particular, the sidewall of the trench 151, i.e., the sidewall of the active region 101, which is formed by selective etching using the active mask 200, is selectively etched to increase the width of the trench 151 and reduce the width of the active region 101. As a result, the active region 101 has a narrower width than the active mask 200.

The etching process of recessing the sidewall of the active region 101 can be a full etch-back process. In practice, isotropic etching, for example, wet etching, can be performed. In this case, the bottom of the trench 151 as well as the sidewall of the trench 151 are etched so that the trench 151 becomes slightly deeper.

Figure 3A:
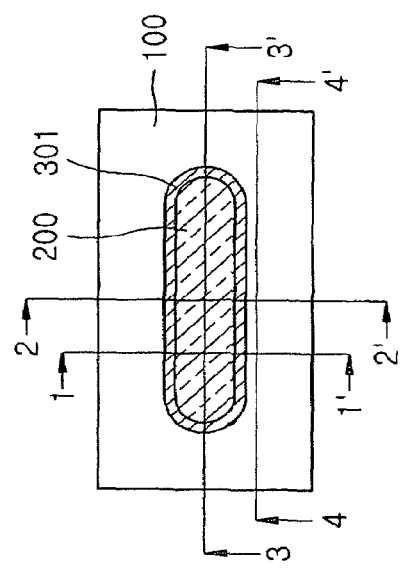
FIGS. 3A and 3B are a plane view and a sectional view, respectively, for explaining a process of forming a spacer on the sidewall of the active region according to an embodiment of the present invention.
Figure 3B:
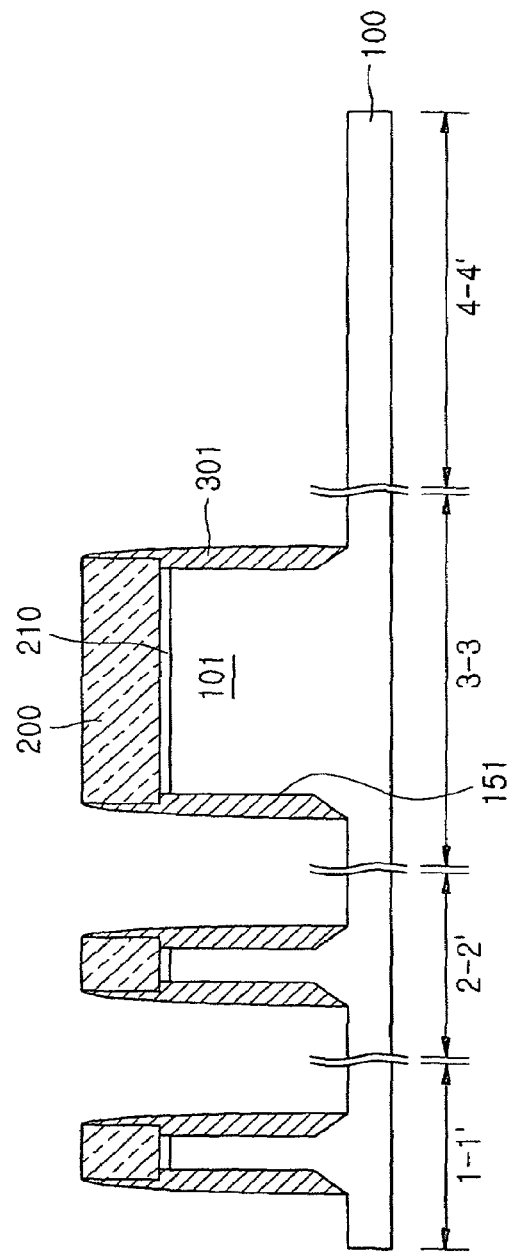

FIGS. 3A and 3B are views for explaining a process of forming a spacer 301 on the sidewall of the active region 101. In particular, the spacer 301 is attached to the sidewall of the trench 151, i.e., the sidewall of the active region 101. The spacer 301 can be formed by depositing a layer and anisotropically etching the layer. The spacer 301 may be formed of an insulating material that is substantially the same as an insulating material used to fill the trench 151. For example, the spacer 301 may include a silicon oxide layer. The spacer 301 is formed so as to make it easier to perform gap-filling on the trench 151 and to suppress formation of a void.

Figure 4A:
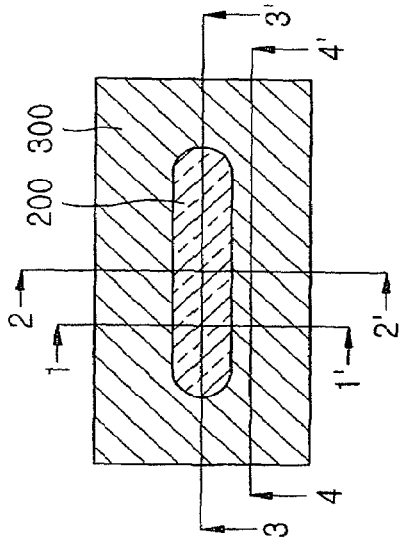
FIGS. 4A, 4B, and 4C are a plane view, a sectional view, and a perspective view, respectively, for explaining a process of forming a first isolation layer filling a trench according to an embodiment of the present invention.
Figure 4B:
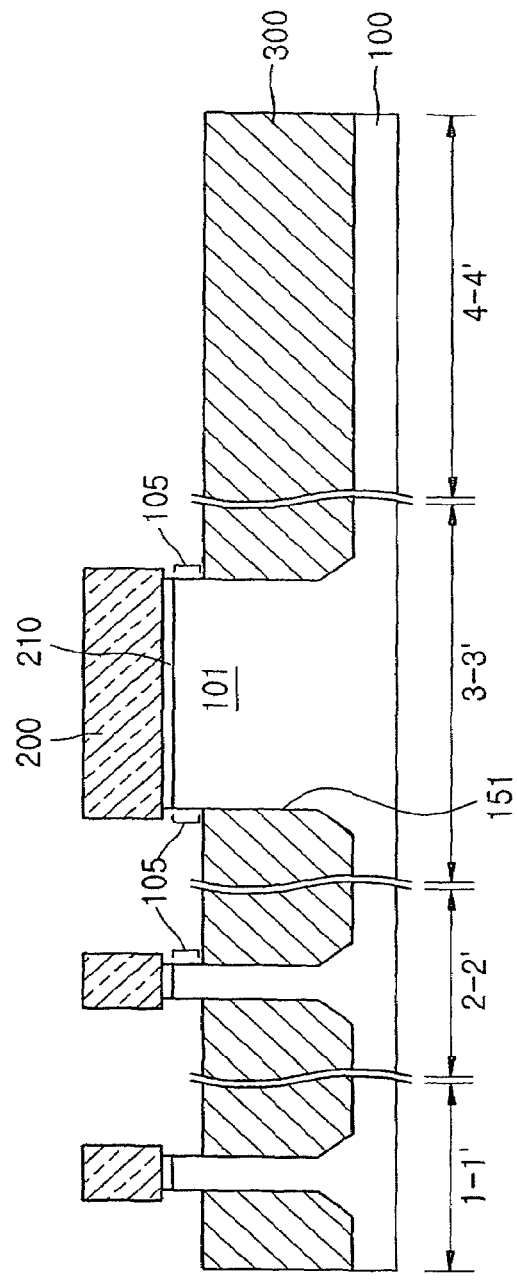
Figure 4C:
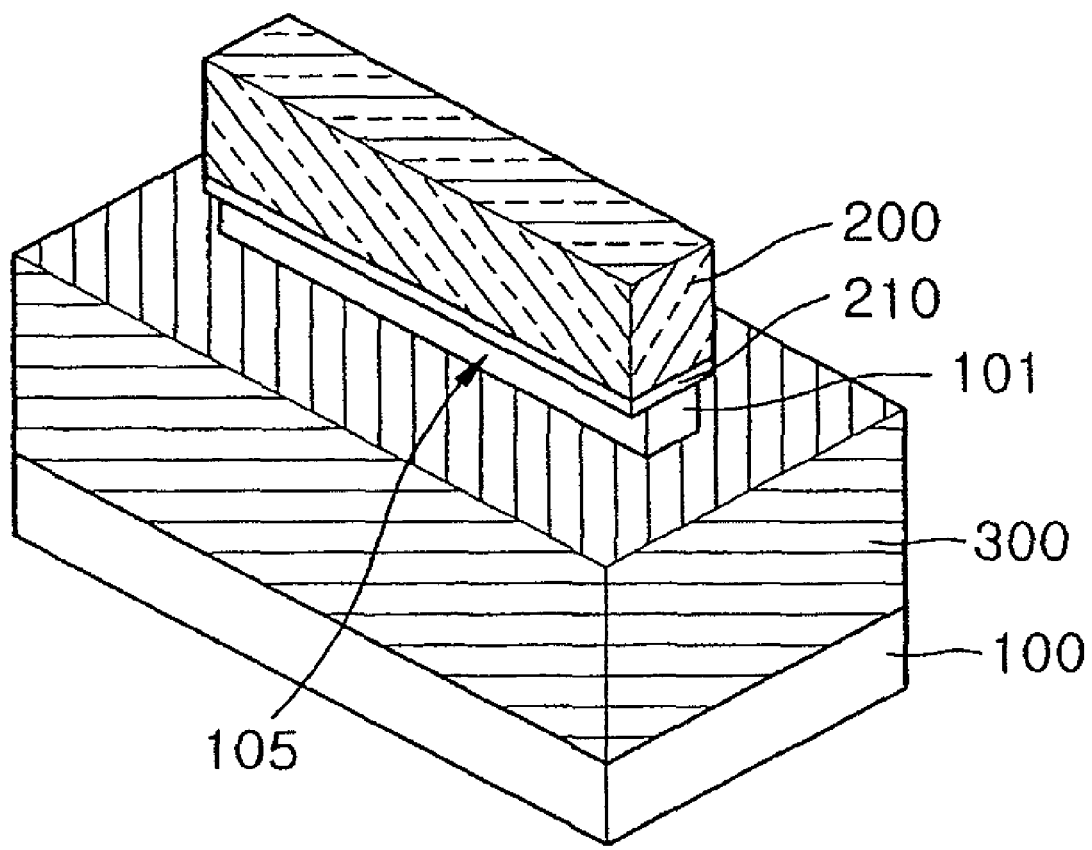

FIGS. 4A, 4B, and 4C are views for explaining a process of forming a first isolation layer 300 filling the trench 151. In particular, the first isolation layer 300 is deposited such as to fill the trench 151 and is then planarized. The planarization process can be performed using chemical mechanical polishing (CMP). The silicon nitride layer of the active mask 200 can be used as a polishing end point. After patterning the first isolation layer 300 to level with the trench 151 using CMP, the first isolation layer 300 is recessed or further etched to a level that is lower than the surface of the active mask 200. The first isolation layer 300 may be etched using wet etching.

This wet etching process is performed until the first isolation layer 300 exposes an upper portion 105 of the active region 101. The width of the exposed upper portion 105 determines the width or thickness of a bar-shaped channel to be formed. In other words, the width of the exposed upper portion 105 determines the junction depth of the cell transistor. Therefore, considering these factors, the width of the upper portion 105 of the active region 101 is determined.

In FIG. 4B, the first isolation layer 300 is illustrated as a layer including the spacer 301. The spacer 301 may be formed of an insulating material that is different from the insulating material 300 used to form the first isolation layer 300. However, considering the process of etching to recess the first isolation layer 300 and subsequent etching processes, as described above, it is preferable that the spacer 301 is formed of the same insulating material as used to form the first isolation layer 300.

Although not illustrated, a liner including a silicon nitride layer may be formed at the interface between the first isolation layer 300 and the substrate 100 or between the spacer 301 and the substrate 100. When the silicon nitride liner is formed and the first isolation layer 300 includes a silicon oxide layer, considering the etching rates of the silicon oxide layer and the silicon nitride layer, the first isolation layer 300 may be recessed using wet etching so as to expose a sufficient width of the upper portion 105 of the active region 101.

Figure 5A:
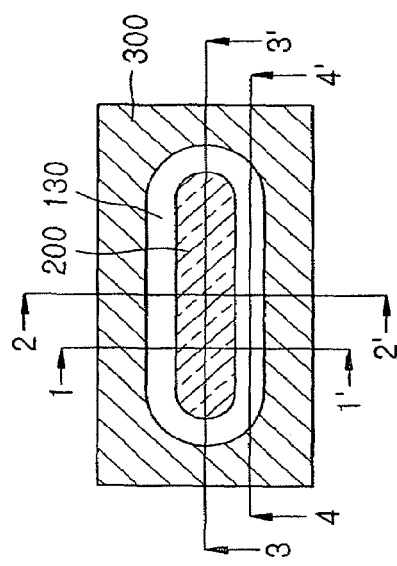
FIGS. 5A, 5B, and 5C are a plane view, a sectional view, and a perspective view, respectively, for explaining a process of forming an active expanding region according to an embodiment of the present invention.
Figure 5B:
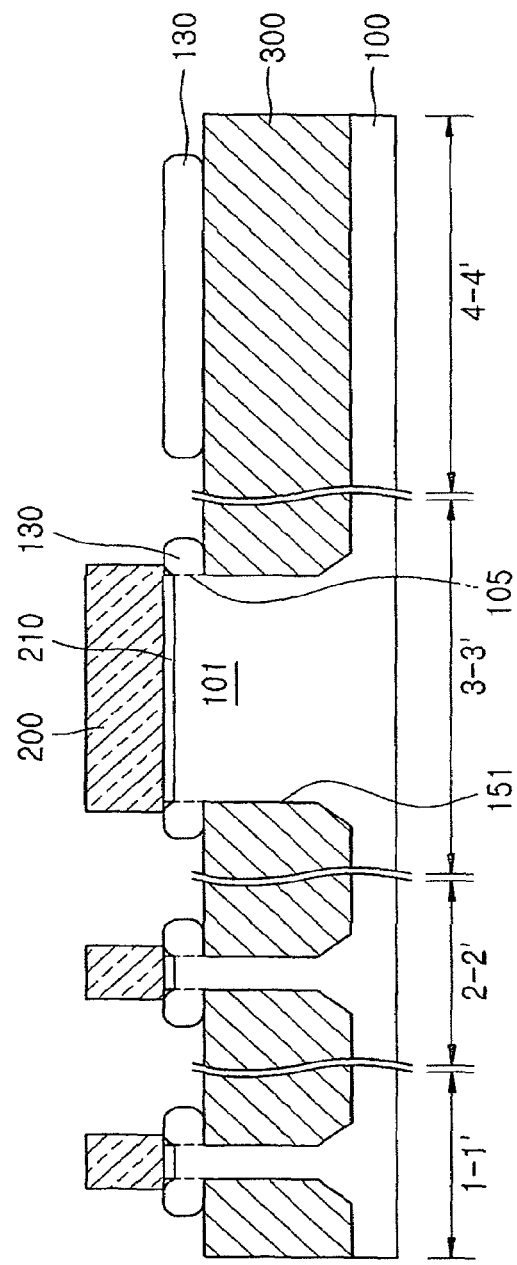
Figure 5C:
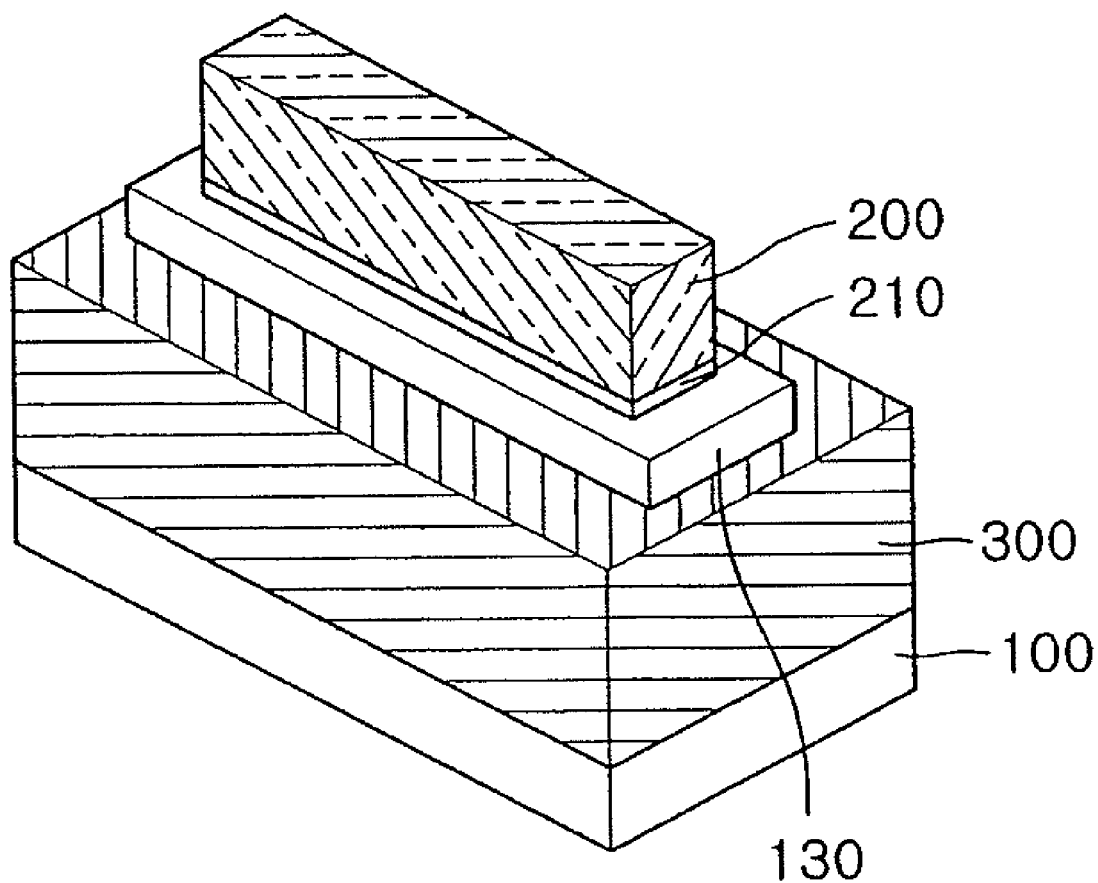

FIGS. 5A, 5B, and 5C are views for explaining a process of forming an active expanding region 130. In particular, the active expanding region 130 is selectively grown at sides of the upper portion 105 of the active region 101 exposed by the first isolation layer 300. The active expanding region 130, which can be used as a source/drain region and/or a channel region of a transistor to be formed thereon, may be grown as a single crystalline semiconductor layer. For example, the active expanding region 130 may include a single crystalline silicon layer grown using SEG.

Since the exposed upper portion 105 of the active region 101 is substantially a side portion of the active region 101 of the semiconductor substrate 100, it is possible to grow a single crystalline layer or a single crystalline semiconductor layer from the exposed upper portion 105 of the active layer 101 composed of single crystalline silicon. Since the upper portion 105 is selectively exposed by the first isolation layer 300 and the active mask 200, the active expanding region 130 can be selectively epitaxially grown from the exposed upper portion 105 of the active region 101.

As a result of the formation of the active expanding region 130, the entire active region extends to be greater than the width or area defined by the trench 151, i.e., the first isolation layer 300. Therefore, when electrically contacting, for example, an SAC, on the active region, the SAC can more stably contact the active region through a large contact area.

Figure 6A:
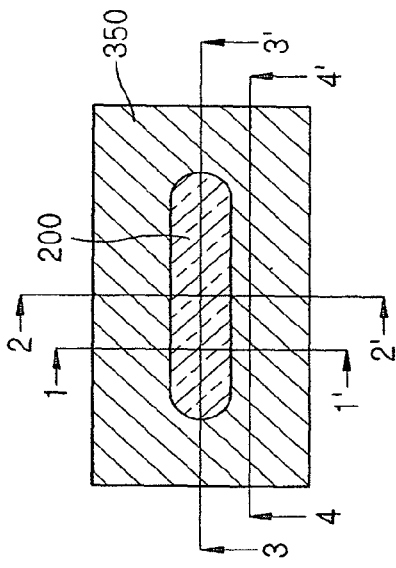
FIGS. 6A, 6B, and 6C are a plane view, a sectional view, and a perspective view, respectively, for explaining a process of forming a second isolation layer separating active expanding regions according to an embodiment of the present invention.
Figure 6B:
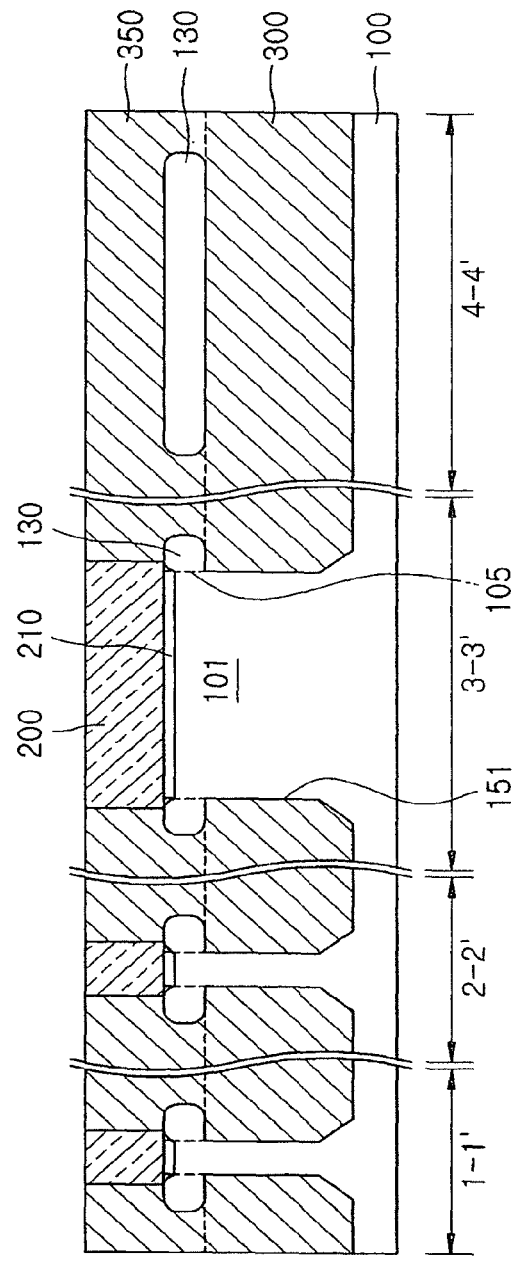
Figure 6C:
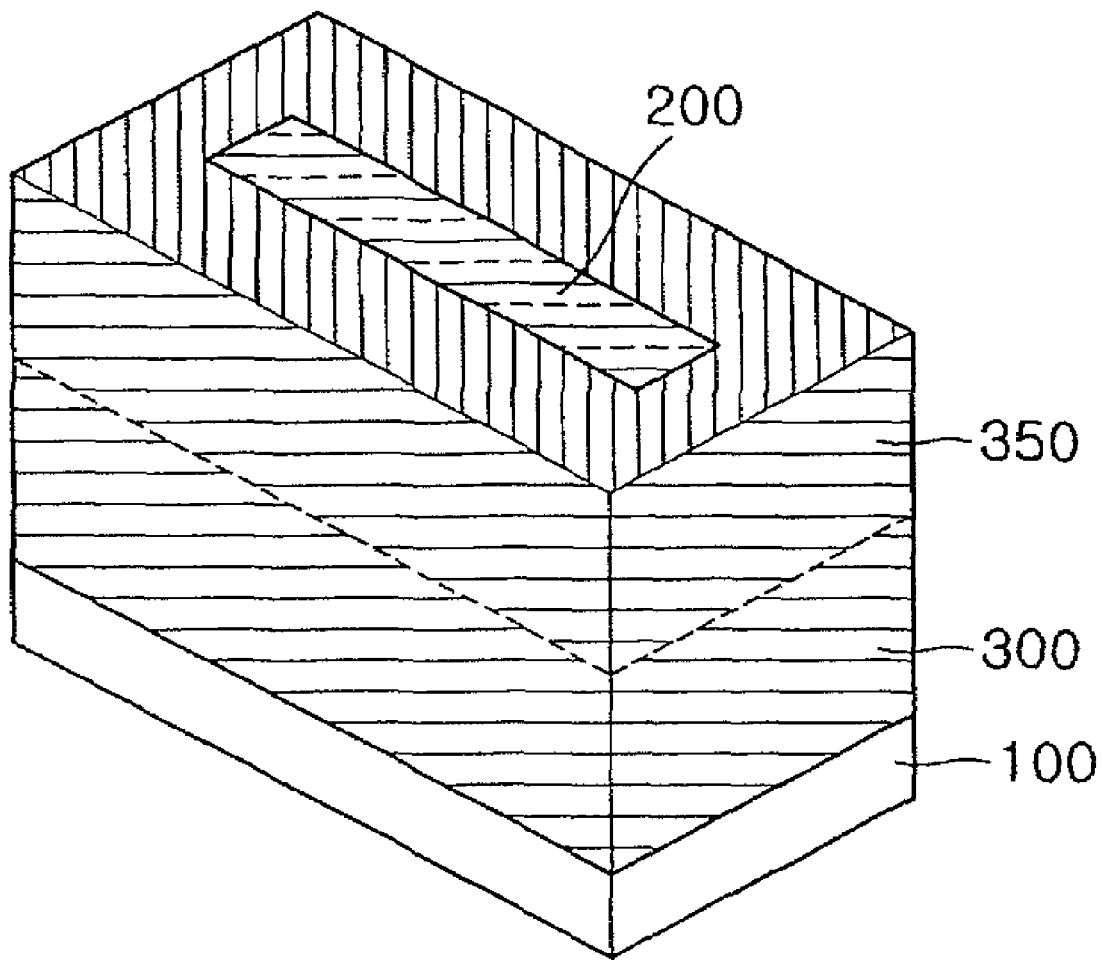

FIGS. 6A, 6B, and 6C are views for explaining a process of forming a second isolation layer 350 separating the active expanding regions 130. In particular, the second isolation layer 350, which separates the active expanding regions 130 by filling the space therebetween, is formed. After depositing the second isolation layer 350, the second isolation layer 350 is planarized using, for example, CMP, until a top surface of the active mask 200 is exposed. The second isolation layer 350 is an interlayer formed in the manufacturing of the device according to an embodiment of the present invention and is practically used as a layer isolating the active expanding regions 130. Therefore, the second isolation layer 350 may be formed of an insulating material, for example, a silicon oxide layer, which is substantially the same as used for the first isolation layer 300.

In an embodiment of the present invention, after the formation of the active region 101 and the active expanding region 130, a portion of the active region 101 is selectively etched away such that a portion of the active expanding region 130 is patterned into a plurality of channel bars to be used as channels of the transistor. The active region 101 may be patterned to allow at least two channel bars to be formed from the separated portion of the active expanding region 130.

The plurality of channel bars formed in the portion of the active expanding region 130 should overlap a gate of the transistor. To this end, a masking layout, i.e., a gate mask, for a gate pattern is used to pattern the active region 101. It is preferable that the active expanding region 130 is not selectively etched to form channel bars and is just separated from the adjacent active region 101. To form an etch mask used to selectively etch a portion of the active region 101, in addition to the gate mask, the active mask 200 can be used after being partially patterned.

An example of forming an etch mask used to form a plurality of channel bars, for example, in a fin structure connecting the active regions 101, in the active expanding region 130 used as a source/drain region, will be described step by step.

Figure 7A:
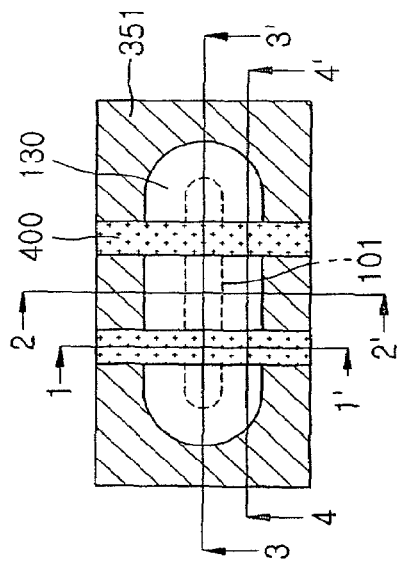
FIGS. 7A, 7B, and 7C are a plane view, a sectional view, and a perspective view, respectively, for explaining a process of forming an active mask second pattern using a dummy gate pattern according to an embodiment of the present invention.
Figure 7B:
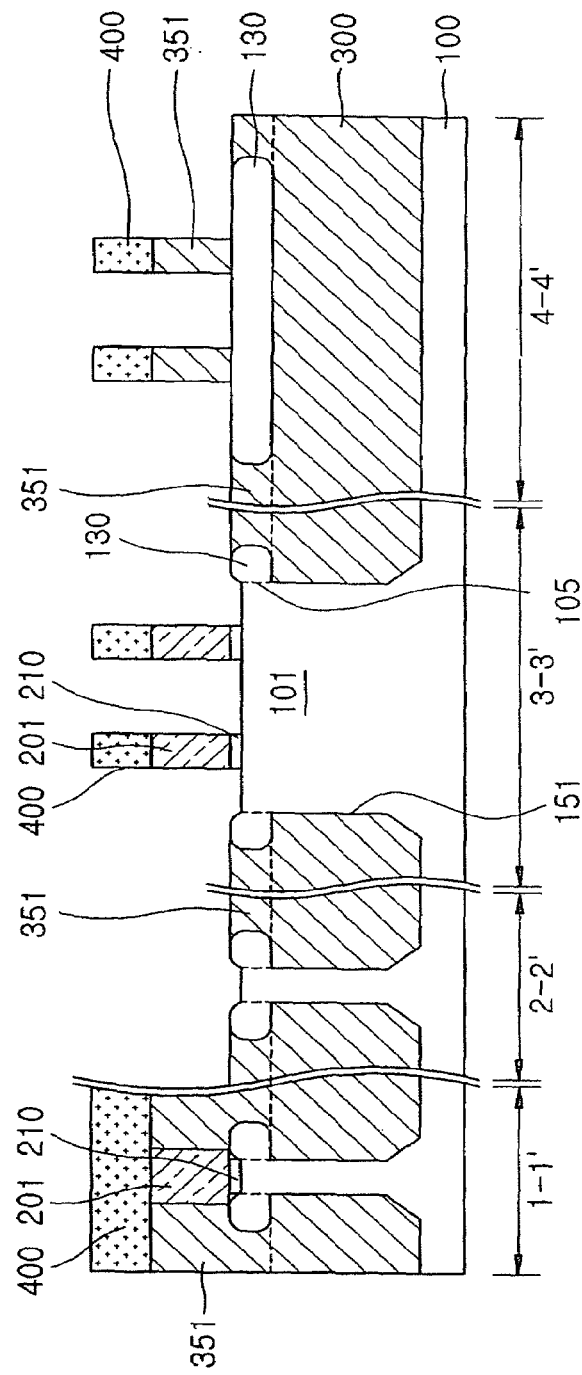
Figure 7C:
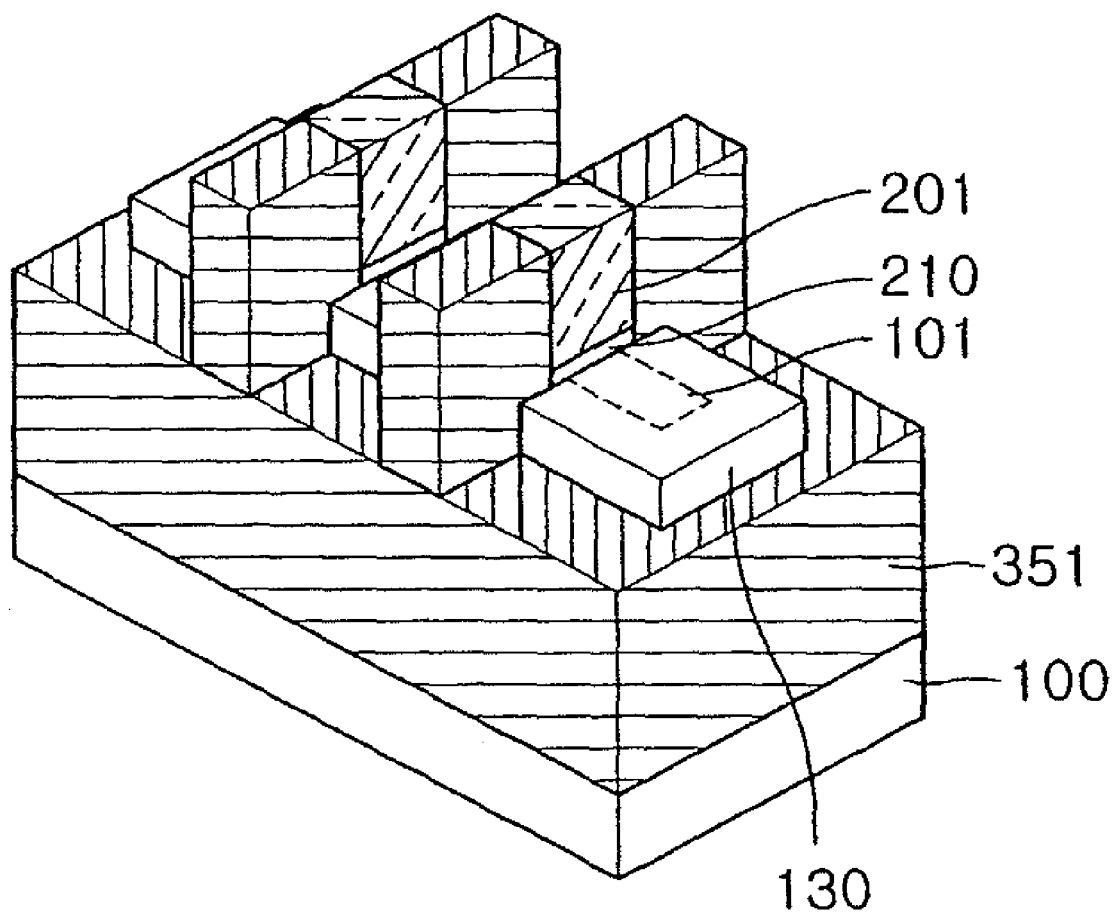

FIGS. 7A, 7B, and 7C are views for explaining a process of forming an active mask second pattern 201, which covers a portion of the active region 101, using a dummy gate pattern 400. In particular, the dummy gate pattern 400, which crosses the active region 101 and the active expanding region 130 attached to the active region 101, is formed on the second isolation layer 350 and the active mask 200 in FIG. 6B.

The dummy gate pattern 400 may be a photoresist pattern formed by a lithography process. The dummy gate pattern 400 can be formed in the same pattern as a gate pattern using a reticle or a photomask, which is used to form the gate pattern of the transistor. Accordingly, the dummy gate pattern 400 is formed as a straight line crossing the active region 101 and the active expanding region 130, as illustrated in FIG. 7A.

Using the dummy gate pattern 400 as an etch mask, a portion of the active mask 200 and a portion of the second isolation layer 35 in FIG. 6B that are exposed by the dummy gate pattern 400, are selectively etched away. This selective etching process may be performed until the surface of the underlying active region 101 and active expanding region 130 attached to the active region 101 is partially exposed.

As a result of the etching process, as illustrated in the cross-sectional view of FIG. 7B and the perspective view of FIG. 7C, the active mask second pattern 201 covering a portion of the active region 101 is formed. The portion of the active region 101 covered by the active mask second pattern 201 is etched away in a subsequent process to allow the adjacent active expanding region 130 to be separated. As a result of using the dummy gate pattern 400, residual second isolation layers 351 remain on both sides of the active mask second pattern 201.

A portion of the active region 101 or a portion of the active expanding region 130, which are exposed by the active mask second pattern 201 and the residual second isolation layer 351, should be protected from etching in a subsequent process. To this end, an additional process of masking these exposed portions is performed.

Figure 8A:
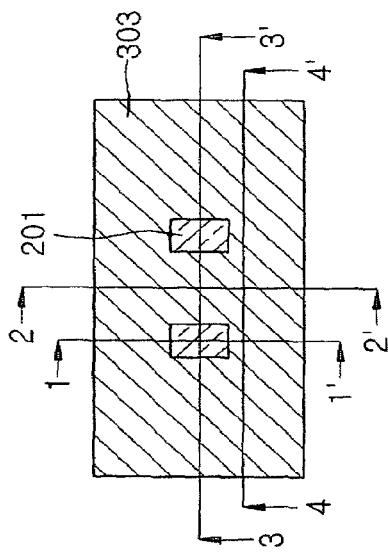
FIGS. 8A and 8B are a plane view and a sectional view, respectively, for explaining a process of forming an etch mask according to an embodiment of the present invention.
Figure 8B:
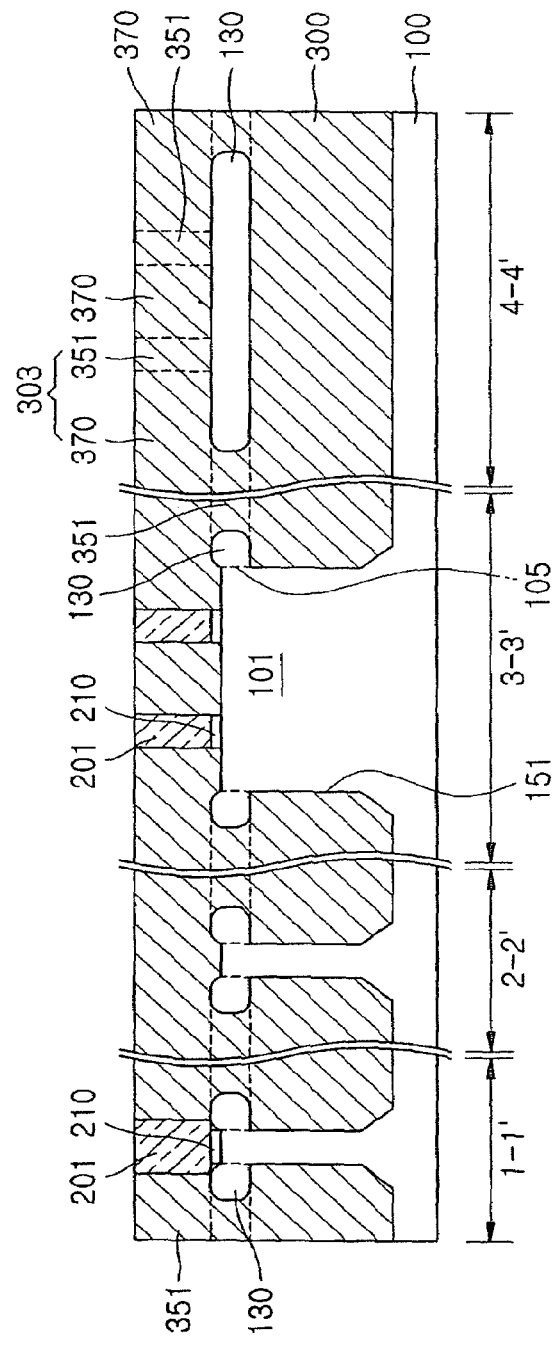

FIGS. 8A and 8B are views for explaining a process of forming an etch mask layer 370 filling the gap between the active mask second patterns 201. In particular, the etch mask layer 370 is formed such that it fills the gap between the active mask second pattern 201 and the residual second isolation layer 351. Next, the etch mask layer 370 is planarized using, for example, CMP.

Here, the etch mask layer 370 is etched using the active mask second pattern 201 as a CMP end point until a top surface of the active mask second pattern 201 is exposed. To this end, the etch mask layer 370 is formed of an insulating material which is different from the silicon nitride used for the active mask second pattern 201. The etch mask layer 370 may be formed of a material that can be removed in a subsequent process at the same etch rate as the residual second isolation layer 351 and has an etching selectivity with respect to the silicon nitride. For example, the etch mask layer 370 can be formed of an oxide layer such as a silicon oxide layer used to form the second isolation layer 351.

The resulting etch mask layer 370 and a portion of the residual second isolation layer 351 form an etch mask 303. The etch mask 303 surrounds and selectively exposes the active mask second pattern 201, as illustrated in the plane view of FIG. 8A.

Figure 9A:
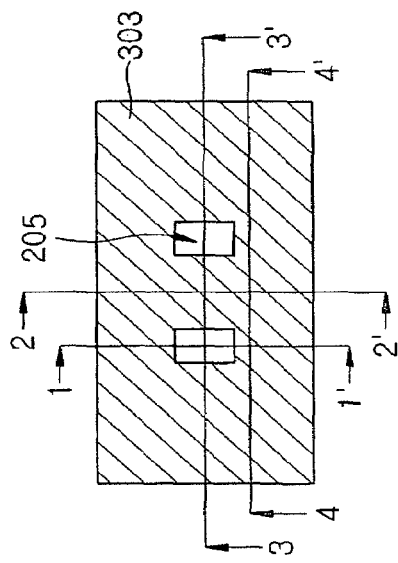
FIGS. 9A and 9B are a plane view and a sectional view, respectively, for explaining a process of removing the active mask second pattern according to an embodiment of the present invention.
Figure 9B:
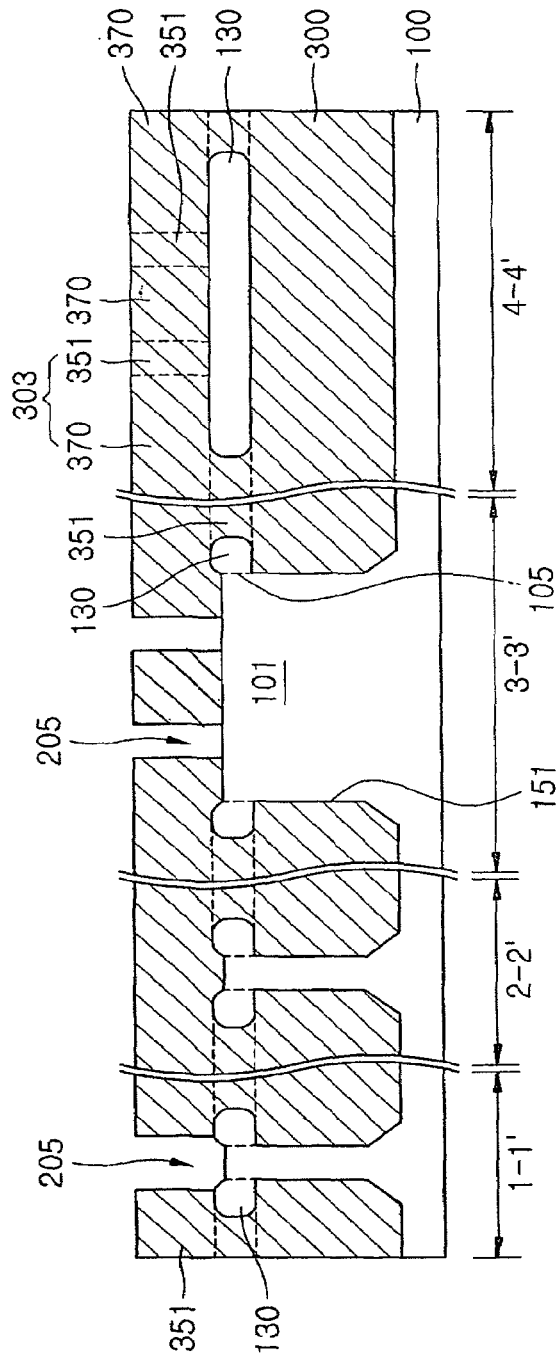

FIGS. 9A and 9B are views for explaining a process of removing the active mask second pattern 201 using the etch mask 303. In particular, the active mask second pattern 201 is selectively removed using the etching selectivity with respect to the etch mask 303. As a result, an opening region 205 selectively exposing a portion of the surface of the active region 101 results in the etch mask 303. The opening region 205 selectively exposes a portion of the active region 101 between the active expanding regions 130, as illustrated in FIG. 9B.

A process of separating the adjacent active expanding regions 130 from the exposed active region 101 using the etch mask 303 is next performed, thereby resulting in a plurality of channel bars.

Figure 10A:
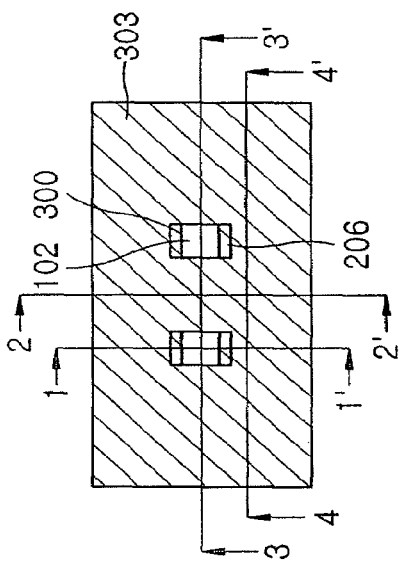
FIGS. 10A and 10B are a plane view and a sectional view, respectively, for explaining a process of forming a groove that separates the active expanding region 130 from the active region according to an embodiment of the present invention.
Figure 10B:
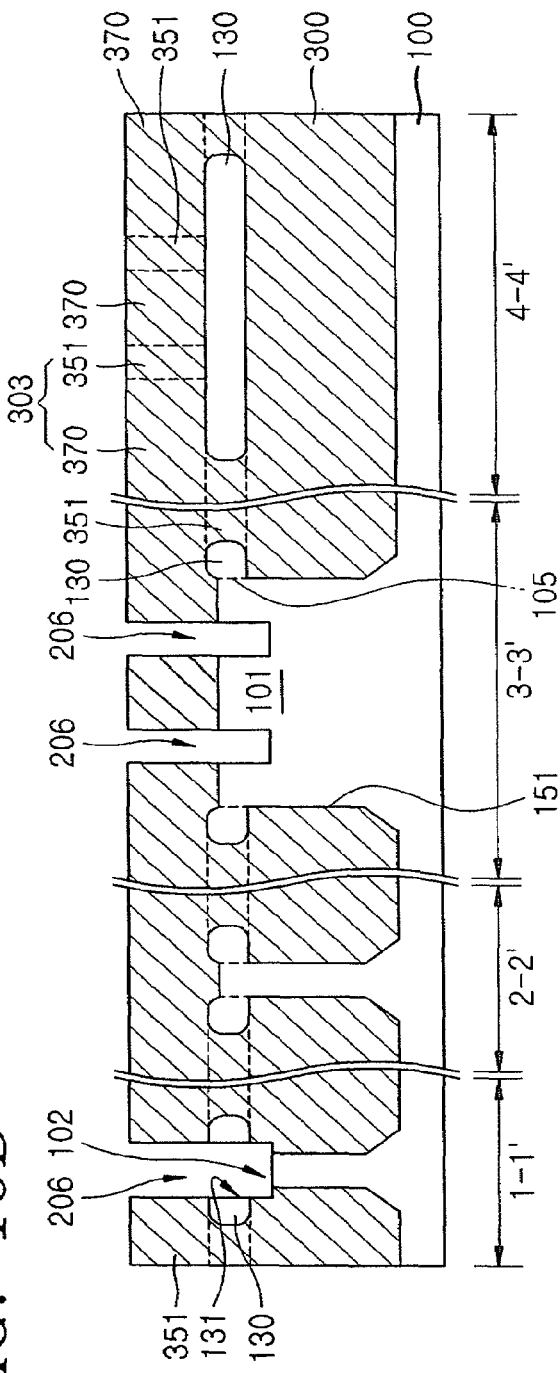

FIGS. 10A and 10B are views for explaining a process of forming in the active region 101 a groove 206, which separates the active expanding region 130 from the active region 101, using the etch mask 303. In particular, a portion of the active region 101 exposed by the etch mask 303 is selectively etched to be recessed. Here, the exposed portion of the active region 101 is etched such that the active expanding region 130 is separated from the active region 101. As a result, the groove 206, which separates the active expanding region 130 from the active region 101, is formed in the exposed portion of the active region 101, as illustrated in FIG. 10B.

The surface of the active region 101 is lowered to a bottom of the groove 206. The lowered surface 102 of the active region is lower than a lower bottom of the separated active expanding region (hereinafter, also referred to as a connection portion) 130. A side of the connection portion 131, i.e., the separated active expanding region, is exposed by the groove 206.

The process of previously recessing the active region 101 inward, which has been described with reference to FIGS. 2A through 2C, makes it easier to form the groove 206 that separates the lowered surface 102 of the active region 101 from the adjacent connection portion 131 of the active expanding region 130. The groove 206 is located in a region which was originally occupied by the active mask second pattern 201, and the active region 101 below the active mask second pattern 201 has been patterned to have a relatively narrow width. Therefore, the groove 206 can be readily formed by etching the active region 101, thereby separating the connection portion 131 of the active expanding region 130 from the active region 101.

As described above, the process of recessing the active region 101 inward, which has been described with reference to FIGS. 2A through 2C, is performed in order to make it easier to form the connection portion 131 of the active expanding region 130. Therefore, the process of recessing the active region 101 can optionally be omitted provided that any modified etching process, for example, over etching, for such separation is performed.

The first isolation layer 300 is substantially exposed by the groove 206. In particular, the connection portion 131 of the active expanding region 130 is separated from the active region 101 by the groove 206, and a side portion of the first isolation layer 300 below the connection portion 131 of the active expanding region 130 is exposed.

Figure 11A:
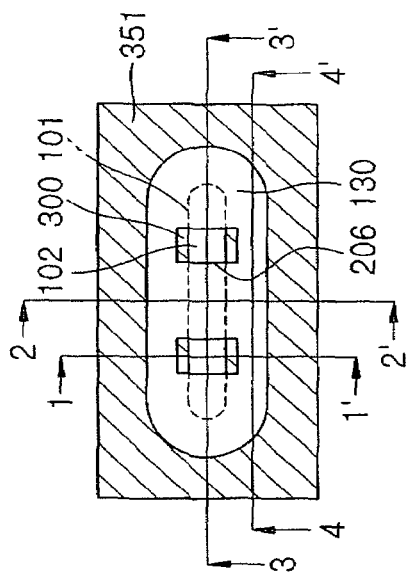
FIGS. 11A, 11B, and 11C are a plane view, a sectional view, and a perspective view, respectively, for explaining a process of removing an etch mask according to an embodiment of the present invention.
Figure 11B:
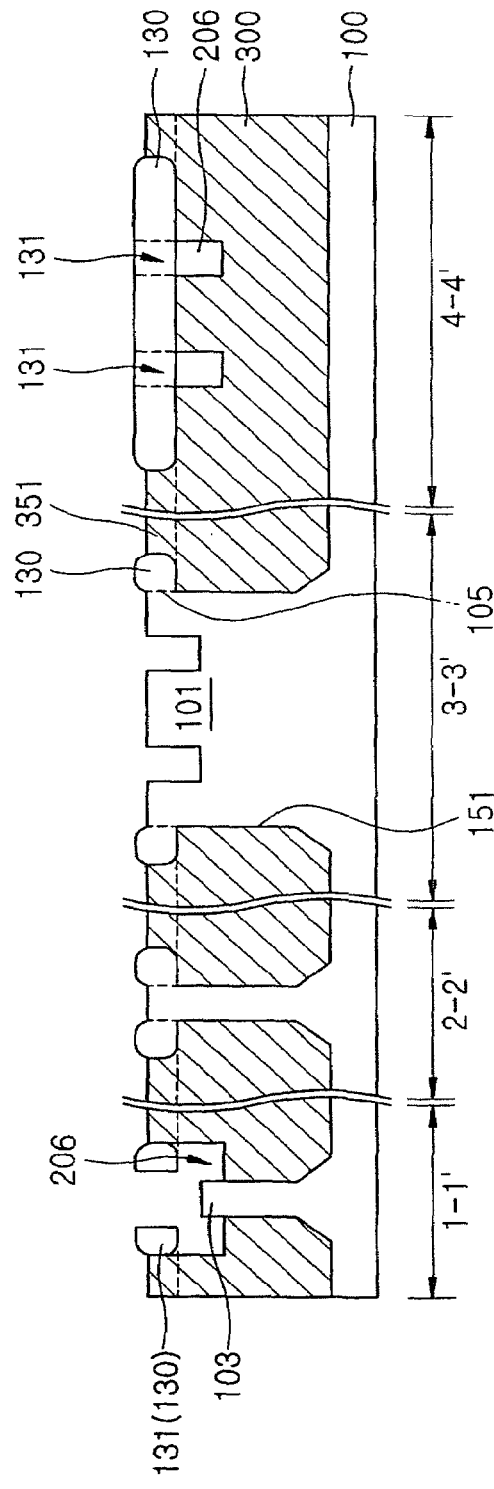
Figure 11C:
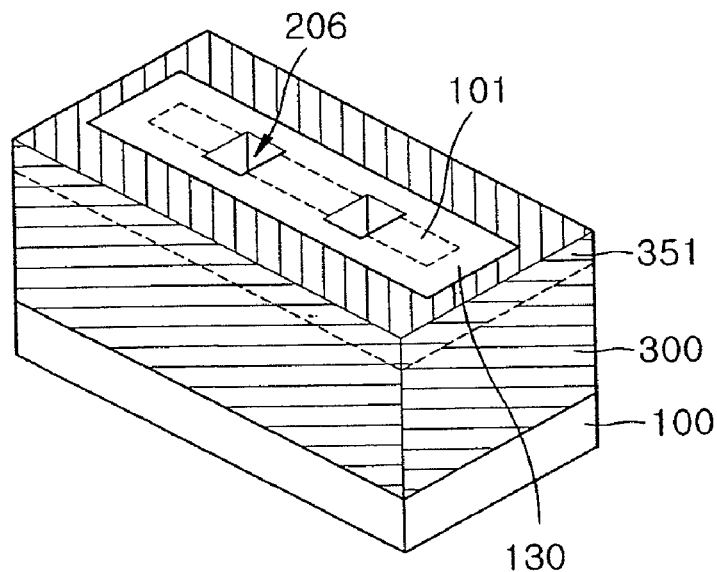

FIGS. 11A, 11B, and 11C are views for explaining a process of removing the etch mask to expose a top surface of the active expanding region 130. In particular, the etch mask 303 used when forming the groove 206 by selective etching is etched away. For example, the etch mask 303 can be removed by a full etch back process.

Etching for removing the etch mask 303 is performed until the top surface of the active region 101 and/or the top surface of the active expanding region 130, which has a height that is almost equal to that of the active region 101, are exposed. Etching, such as a pull etch back process, can be performed using the etching selectivity between silicon oxide, which composes the etch mask 303, and silicon, which composes the active region 101 and/or the active expanding region 130. This etching process can be a wet or dry etching process. However, a wet etching process is preferred.

In the pull etch back process, the side portion of the first isolation layer 300 exposed by the groove 206 can be etched. The exposed portion of the first isolation layer 300 can be effectively etched using isotropic etching such as wet etching in the pull etch back process. As a result of the etching process, the portion of the first isolation layer 300 below the connection portion 131 of the active expanding region 130 is removed so that the groove 206 extends to that portion of the first isolation layer 300, and a bottom of the connection portion 131 of the active extended portion 130 is exposed by the groove 206.

Only one side of the connection portion 131 of the expended active portion contacts the second isolation layer 351 and the other sides of the connection portions 131 are exposed. The connection portion 131 of the active expanding region is used as a channel bar to be a channel of the transistor. Therefore, advantageously, an effect of increasing the area of the connection portion 131 that overlaps a gate can be obtained when the exposed surface of the connection portion 131 of the active expanding region is relatively large.

When the process of removing the etch mask 303 by such as a pull etch back process continues further, the connection portion 131 of the active expanding region can be completely separated from both the first isolation layer 300 and the second isolation layer 351. In other words, all the sides of the connection portion 131 can be exposed. By doing so, a gate surrounding the connection portion 131 of the active expanding region, i.e., a channel bar, can be constructed. However, this case is disadvantageous in that the respective heights of the first isolation layer 300 and the second isolation layer 351 decrease. Therefore, it is advantageous to expose all the sides of the connection portion 131 of the active expanding region, i.e., a channel bar, without a reduction in the respective heights of the first isolation layer 300 and the second isolation layer 315.

As the groove 206 extends, a portion 103 of the active region 101 protrudes in a lower portion of the groove 206. A top surface and side portions of the protruded portion 103 of the active region 101 are exposed by the groove 206. The protruded portion 103, which is a connection portion, overlaps the gate, so that the protruded portion 103 can be used as a channel of the transistor when a profile of a source/drain region is properly controlled. In other words, the protruded portion 103 of the active region in the lower portion of the groove 206 also can be used as a channel bar.

Therefore, in an area underlying the gate, three bars 131 and 102, which seem to be the apexes of a triangle, can be formed. The bars 131 and 102 can be used as channels.

After the process of enlarging the groove 206, a silicon trimming process can be further performed. In addition, by performing thermal treatment in a hydrogen atmosphere, the profiles of the channel bars 131 and 103, i.e., the connection portion 131 of the active expanding region and the protruded connection portion 103 of the active region can be smoothened, for example, such that the channel bars 131 and 103 have a smooth circular or elliptical cross-section. The apexes of the acute triangular structure are smoothened, thereby preventing an electric field from concentrating in the acute angle areas.

Figure 12:
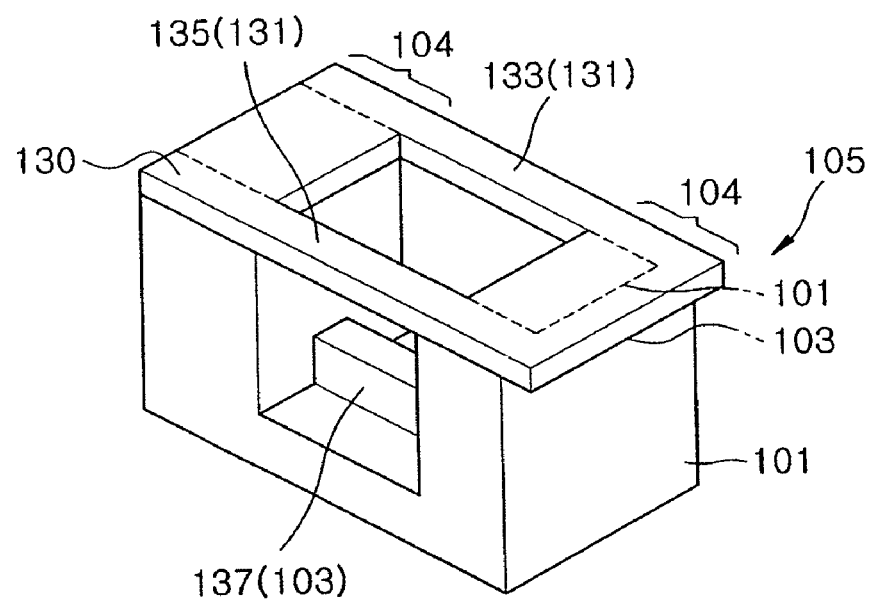
FIG. 12 is a perspective view of an active pattern according to an embodiment of the present invention.

An active pattern including the active region 101 and the active expanding region 103, which is formed by the above-described processes, is illustrated in FIG. 12.

FIG. 12 is a perspective view of an active pattern according to an embodiment of the present invention. Referring to FIG. 12, an active pattern 105 according to an embodiment of the present invention includes the active region 101 and the active expanding region 130. The active expanding region 130 is attached to an upper side portion of the active region 101 as a bar or ring. The active expanding region 130 can be a semiconductor layer grown by SEG.

As described above, the active pattern 105 can be formed by selectively removing a portion of the active region 101 between the active expanding regions 130. In the active pattern 105, two active regions 104 for a source/drain are spatially separated from one another and are connected by three channel bars 133, 135, and 137, which may have a wire or bar shape. The first and second channel bars 133 and 135, among the three channel bars 133, 135, and 137, correspond to the connection portions 131 of the active extended portion 130, and the third channel bar 137 corresponds to the protruded portion 103 of the active region 101 in the lower portion of the groove 206.

Transistors having various structures can be manufactured using the active pattern 105. A transistor can be manufactured by forming a gate dielectric layer on the channel bars 133, 135, and 137 of the active pattern 105, forming a gate on the gate dielectric layer to overlap with the channel bars 133, 135, and 137, and forming a source/drain near the gate.

All three channel bars 133, 135, and 137 can optionally be used as channels. However, in practice, only two channel bars, i.e., the first and second channel bars 133 and 135, which face each other, are used as channels. The gate can be formed to completely or partially surround the channel bars 133, 135, and 137.

Hereinafter, processes of forming a gate on the channel bars 133, 135, and 137 and forming a source/drain junction according to embodiments of the present invention will be described.

Figure 13A:
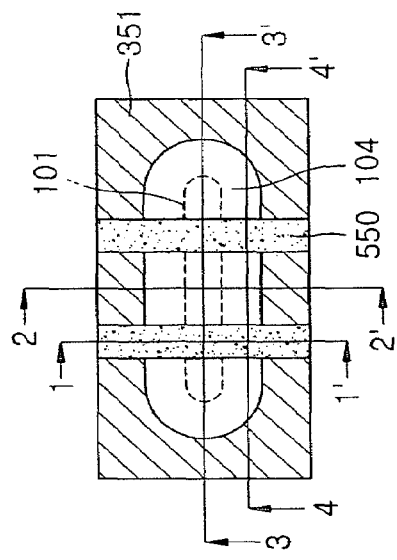
FIGS. 13A and 13B are a plane view and a sectional view, respectively, for explaining a process of forming a gate according to an embodiment of the present invention.
Figure 13B:
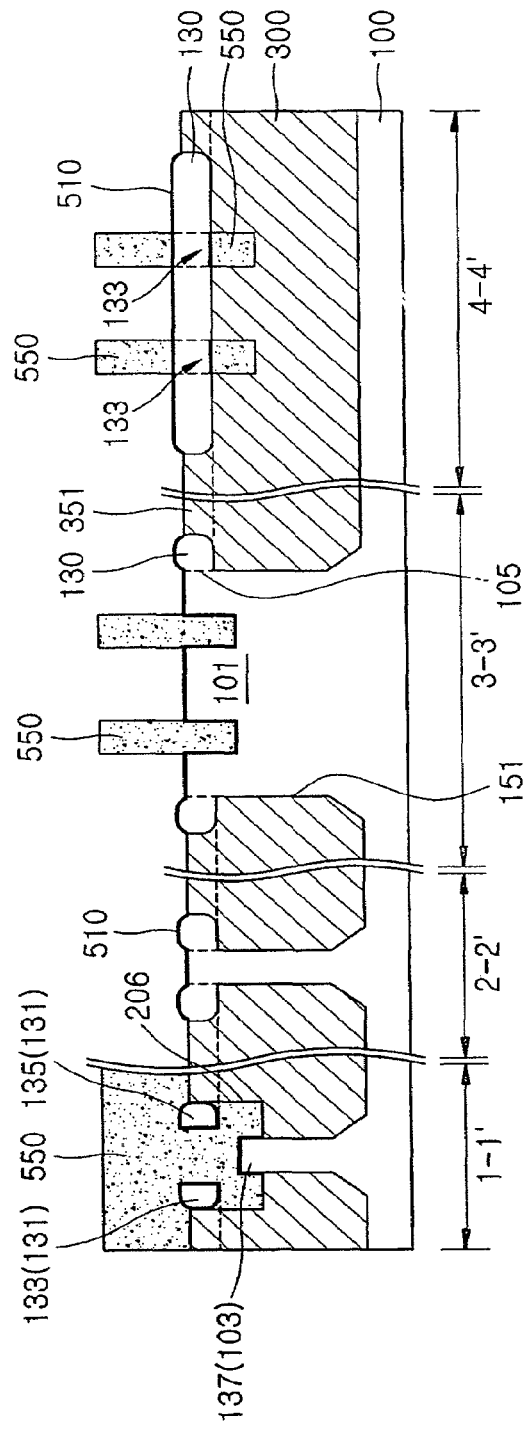

FIGS. 13A and 13B are views for explaining a process of forming a gate 550 filling the groove 206. In particular, a gate dielectric layer 510 is formed on an exposed surface of the active region 101 and the active extended portions 130 and 131. The gate dielectric layer 510 can be a silicon oxide layer grown by thermally oxidizing silicon. Next, a gate layer is formed to cover the gate dielectric layer 510. The gate layer may include a doped polycrystalline silicon layer.

The gate layer is patterned into the gate 550 by selective etching using a gate mask. The gate 550 fills the groove 206 and covers the three channel bars 133, 135, and 137. The gate 550 contacts the top surface, bottom surface, and one side portion of each of the first and second channel bars 133 and 135.

In an active area 104 including the active region 101 and a portion of the active expanding region 103, a source/drain region is defined by ion implantation, thereby resulting in a transistor. The source/drain region can be defined by doping impurities. In this case, all the three channel bars 133, 135, 137, which may have a wire shape, or only two channel bars 133 and 135 facing each other can be used as channels for the transistor depending on a doping profile of the source/drain region. Since there is a height difference between the first and second channel bars 133 and 135 and the third channel bar 137 as measured from the substrate 100, the position of the junction may vary. Therefore, the ion implantation process is performed in consideration of junction depth.

FIG. 14A is a view for explaining a process of forming a source/drain region 530 in the active expanding region 130. In particular, after the gate 550 is formed, impurity ions are implanted into a region including the active region 101 and the active expanding region 130 near the gate 550, thereby resulting in the source/drain region 530. When the depth of a doping profile of the source/drain region 530 does not reach the third channel bar 137, substantially only the first and second channel bars 133 and 135 are used as channels.

In this case, the source/drain region 530 formed in the active expanding region 130 near the first and second channel bars 133 and 135 can substantially act as a source/drain. The first isolation layer 300 underlies the active expanding region 130 adjacent to the first and second channel bars 133 and 135, as illustrated in area 4-4' of FIG. 14A. In other words, an oxide junction is formed due to the insulating layer underlying the source/drain region 530. As a result, junction current leakage in the source/drain can be prevented.

FIG. 14B is a view for explaining a process of forming a source/drain region 531 that is deep enough to contact the third channel bar 103. In particular, after the gate 550 is formed, impurity ions are implanted into a region including the active region 101 and the active expanding region 130 near the gate 550, thereby resulting in the source/drain region 531. Ion implantation can optionally be performed such that the depth of a doping profile of the source/drain region 531 reaches below the active expanding region 130, i.e., at or below the third channel bar 147. In this case, substantially all the first, second, and third channel bars 133, 135, and 137 can be used as channels.

The first isolation layer 300 underlies the active expanding region 130 adjacent to the first and second channel bars 133 and 135, as illustrated in area 4-4' of FIG. 14B. In other words, a partial oxide junction is formed due to the insulating layer underlying a portion of the source/drain region 531. As a result, junction current leakage in the source/drain can be prevented.

Instead of forming the gate 550 to partially surround the first and second channel bars 133 and 135, the gate 550 can be formed to completely surround the first and second channel bars 133 and 135. To this end, the residual second isolation layer 351 around the first and second channel bars 133 and 135 is removed such that the surfaces of the first and second channel bars 133 and 135 are fully exposed.

Figure 15A:
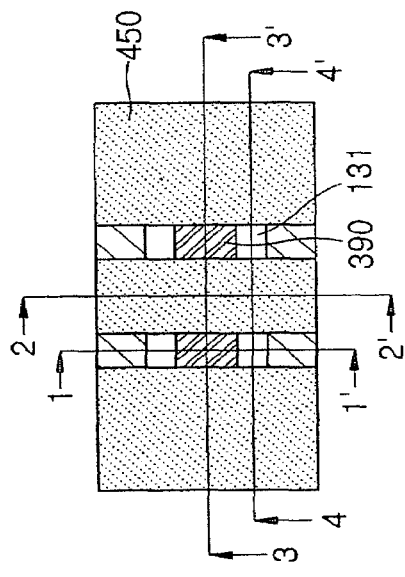
FIGS. 15A and 15B are a plane view and a sectional view, respectively, for explaining a process of forming a reverse gate pattern mask according to an embodiment of the present invention.
Figure 15B:
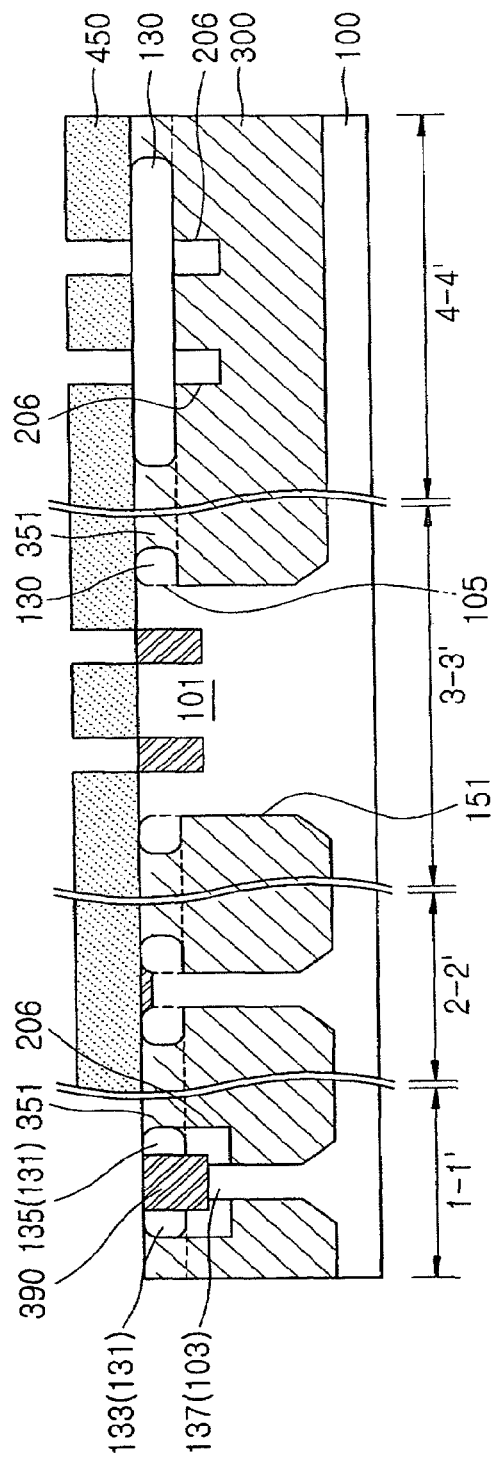

FIGS. 15A and 15B are views for explaining a process of forming a reverse gate pattern mask 450 used to fully expose the surfaces of the first and second channel bars 133 and 135. In particular, to selectively remove a portion of the second isolation layer 315 that contacts the first and second channel bars 133 and 135, the reverse gate pattern mask 450, which has a reverse pattern with respect to the gate mask, is formed on the semiconductor substrate 100.

To protect the exposed third channel bar 137 in the groove 206 and/or the active region 101 during the etching process, the groove 206 is filled with a sacrificial layer 390 prior to the etching process. The sacrificial layer 390 may be formed of an insulating material, such as a silicon oxide layer, which is substantially the same as used for the second isolation layer 351. The silicon oxide layer is deposited using a method or in a condition that leads to inferior step coverage not to completely fill the groove 206 and to just cover the third channel bar 370 and/or the active region 101.

Next, the reverse gate pattern mask 450, which has a reverse pattern with respect to the gate pattern, is formed of a silicon nitride layer that has an etching selectivity with respect to a photoresist or silicon oxide pattern formed using, for example, a lithography process.

Figure 16A:
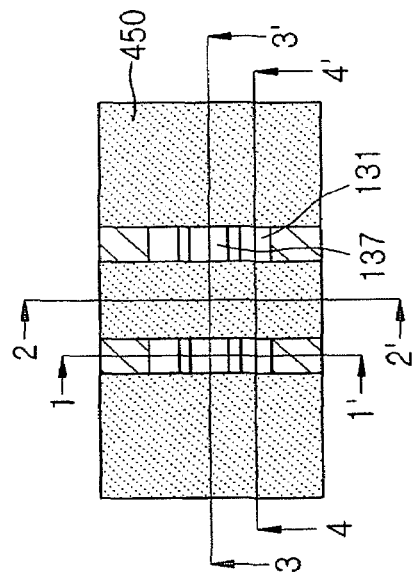
FIGS. 16A, 16B, and 16C are a plane view, a sectional view, and a perspective view, respectively, for explaining a process of fully exposing the surface of the first and second channel bars according to an embodiment of the present invention.
Figure 16B:
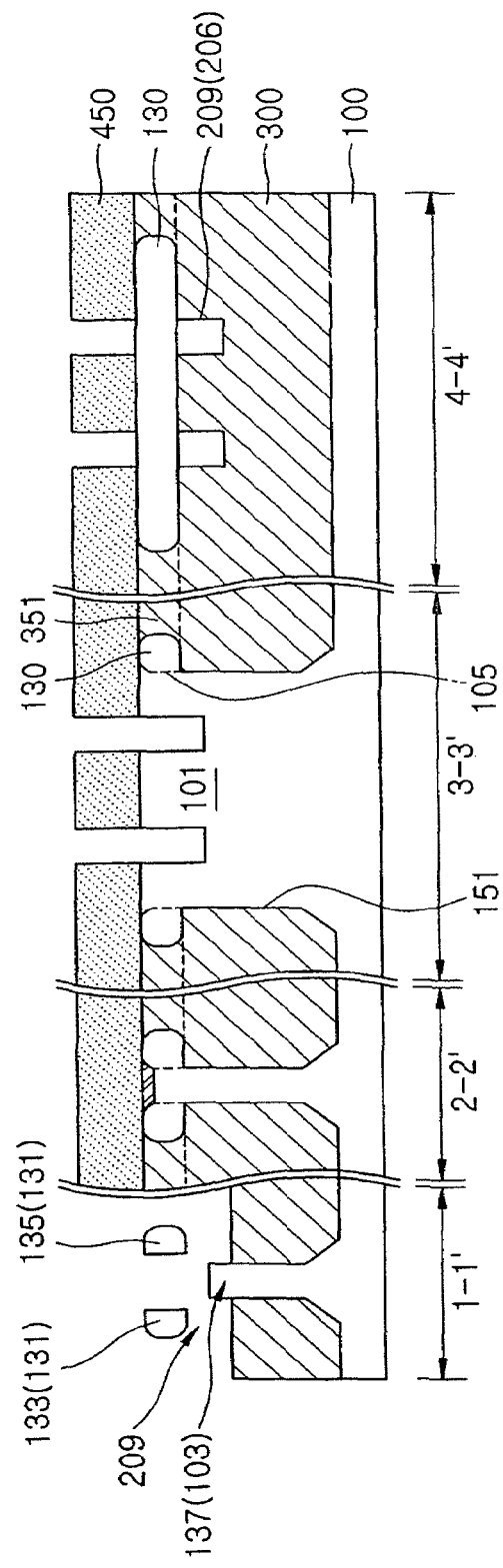
Figure 16C:
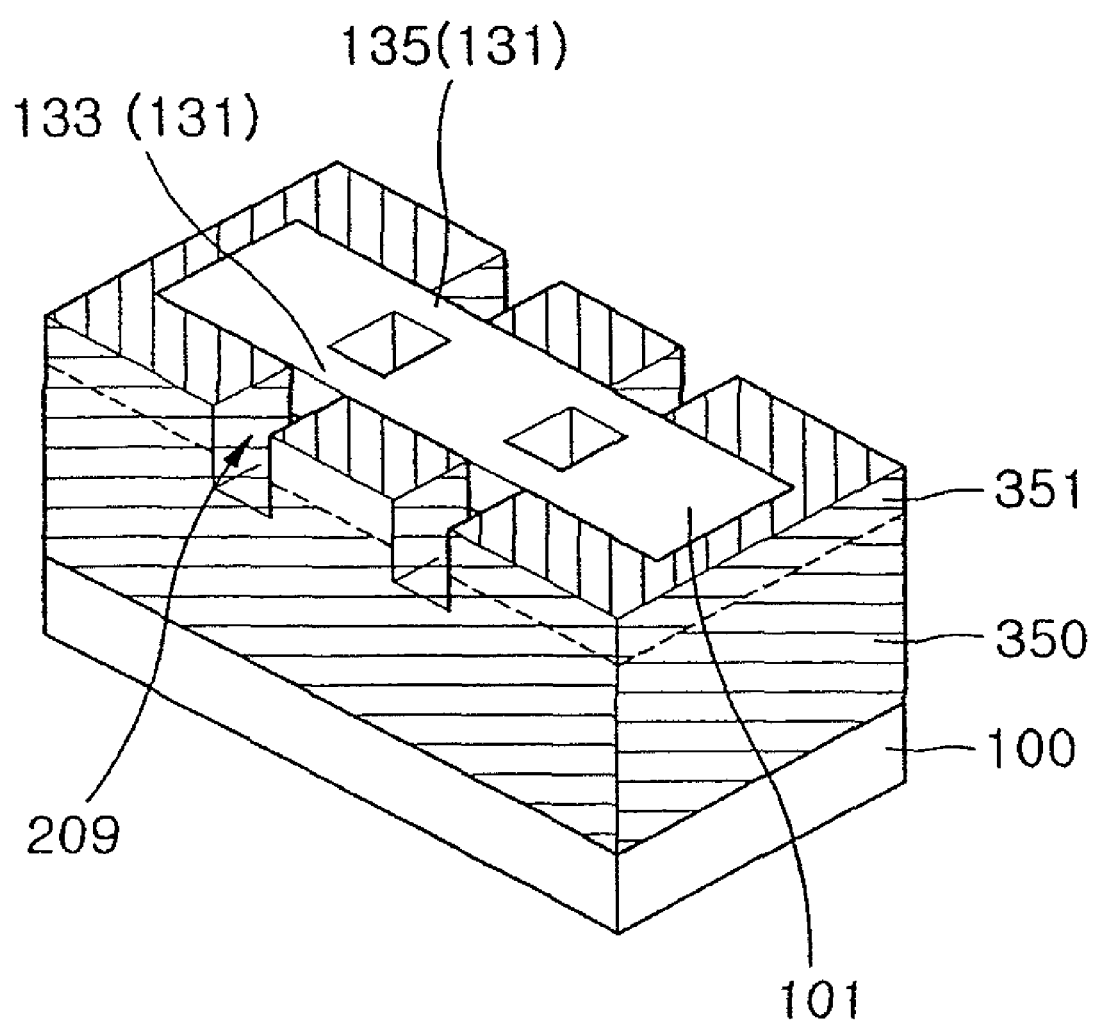

FIGS. 16A, 16B, and 16C are views for explaining a process of fully exposing the surface of the first and second channel bars 133 and 135. In particular, exposed portions of the second isolation layer 351 and the sacrificial layer 390 are selectively etched away using the reverse gate pattern mask 450 as an etch mask. During this etching process, a silicon oxide that has an etching selectivity with respect to a semiconductor material, such as silicon, which forms the active region 101 and/or the active expanding region 130, is selectively etched.

During the etching process, a portion of the second isolation layer 351 that contacts the first and/or second channel bars 133 and 135 is removed, thereby resulting in a groove 209 exposing all the sides of the first and/or second channel bars 133 and 135. Therefore, the first and/or second channel bars 133 and 135 seem to suspend in the groove 209 in FIG. 16B. In other words, all the sides of the first and/or second channel bars 133 and 135 do not contact any layer and are fully exposed. As a result, the active pattern 105 including the first and/or second channel bars 133 and 135 whose sides are exposed is obtained, as illustrated in the perspective view of FIG. 12.

Next, the reverse gate pattern mask 450 is selectively removed.

Figure 17A:
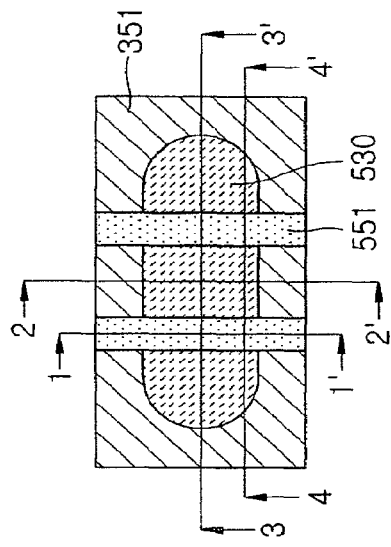
FIGS. 17A, 17B, and 17C are a plane view, a sectional view, and a perspective view, respectively, for explaining a process of forming a gate surrounding upper channel bars, in accordance with the present invention.
Figure 17B:
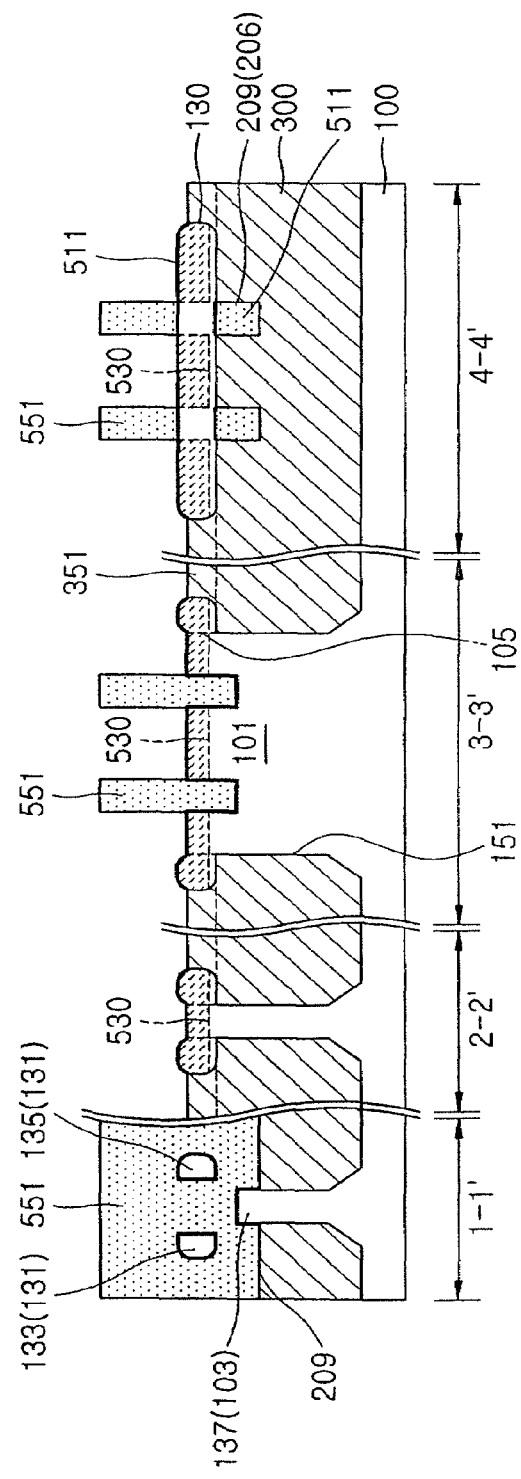
Figure 17C:
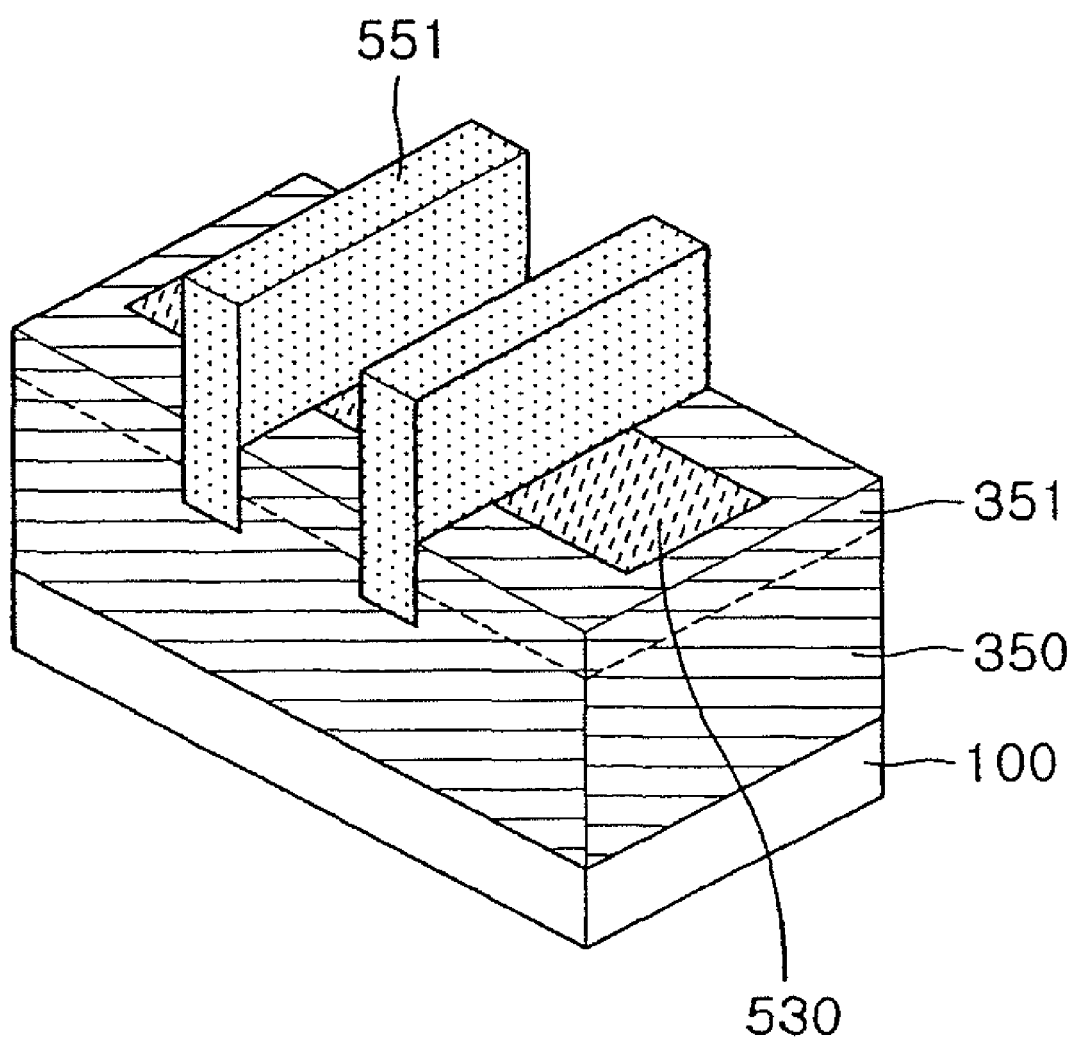

FIGS. 17A, 17B, and 17C are views for explaining a process of forming a gate 551 surrounding the first and second channel bars 133 and 135. In particular, a gate dielectric layer 511 is formed on exposed surfaced of the active region 101 and the active expanding regions 130 and 131. The gate dielectric layer 511 can be a silicon oxide layer grown by thermally oxidizing silicon. Next, a gate layer is formed to cover the gate dielectric layer 511. The gate layer may include a doped polycrystalline silicon layer.

The gate layer is patterned into the gate 551 by selective etching using a gate mask. The gate 551 fills the grooves 209 and covers the three channel bars 133, 135, and 137. The gate 551 surrounds the first and second channel bars 133 and 135.

Next, in the active region 104 (refer to FIG. 12), which includes the active region 101 and a portion of the active expanding region 103, a source/drain region 530 is defined by ion implantation, thereby resulting in a transistor. Since there is a height difference between the first and second channel bars 133 and 135 and the third channel bar 135 as measured from the substrate 100, as described with reference to FIGS. 14A and 14B, considering the position of a junction, the depth of the source/drain region 530, i.e., the depth of the junction, is controlled when performing ion implantation.

As illustrated in FIG. 17C, two gates 551 are formed parallel to each other in one active region 101, thereby resulting in a twin transistor structure. The twin gates 551 fully covering the channel bars 133 and 135 form all-around-type transistors. In this case, the effects described with reference to FIGS. 13A through 14B also can be achieved, thereby resulting in improved transistor characteristics.

As described above, according to the present invention, an upper side portion of an active region in a memory cell is partially etched, and a semiconductor layer is grown on the etched portion of the active region by selective epitaxial growing (SEG) to extend the active region. As a result, a larger contact area is obtained, and a multi-channel fin (MC Fin) structure can be obtained from the semiconductor layer grown by SEG and the body of a substrate.

A bar structure for three channels can be formed using processes involved in manufacturing a MC Fin structure and oxide etching processes. In a state where bottoms of the channel bars which are located above the other channel bar are exposed, patterning is performed using a gate mask as when forming a recess groove for a recessed cell array transistor (RCAT) so that a transistor having a twin-all-around structure with a greater cell transistor current retaining capability can be manufactured.

A structure for preventing a junction leakage can be formed by contacting a portion underlying the source/drain of the transistor with an STI oxide layer. In other words, a partially insulated (Pi) FET with a self-defined junction can be constructed by placing an oxide junction below the active region. As a result, the refresh characteristics of a DRAM due to the reduced current leakage from the junction can be improved.

In addition, the generation of voids when forming the STI layer can be prevented by additionally forming an oxide spacer when forming the STI layer.

While the present invention has been particularly shown and described with reference to exemplary embodiments thereof, it will be understood by those of ordinary skill in the art that various changes in form and detail may be made herein without departing from the spirit and scope of the present invention as defined by the following claims.

What is claimed is:

1. A method of manufacturing a multi-channel transistor device, the method comprising;
    defining an active region in a semiconductor substrate by forming a first isolation layer exposing an upper side portion of the active region;
    forming an active expanding region on the exposed upper side portion of the active region by selective epitaxial growth (SEG);
    forming on the first isolation layer a second isolation layer that separates adjacent active expanding regions;
    selectively etching a portion of the active region to define channel bars in the active expanding region that extend between first and second laterally separated portions of the active region;
    selectively removing a portion of the first isolation layer that contacts bottom surface portions of the channel bars such as to expose the bottom surface portions of the channel bars;
    forming a gate dielectric layer on exposed surfaces of the channel bars;
    forming a gate on the gate dielectric layer; and
    forming a source/drain region in a region of the active expanding region adjacent to the gate.

2. The method of claim 1, wherein in the selectively etching of the portion of the active region to define the channel bars, the active region is etched to a level that is lower than the bottoms of the channel bars such that portions of the first isolation layer that are in contact with the bottom surface portions of the channel bars are exposed.

3. The method of claim 1, wherein the selectively removing the portion of the first isolation layer comprises recessing side portions of the first isolation layer that are exposed by etching the active region.

4. The method of claim 1 further comprising selectively removing portions of the second isolation layer that remain on both sides of the channel bars to expose all sides of the channel bars after the selectively removing of the first isolation layer.

5. The method of claim 4, wherein the gate surrounds all the exposed sides of the channel bars.

6. The method of claim 1 further comprising annealing the channel bars in a hydrogen-containing atmosphere before the forming of the gate dielectric layer.

7. The method of claim 1, wherein the source/drain region forms a junction with the first isolation layer underlying the active expanding region.

8. The method of claim 1, wherein the source/drain region extends to the active region adjacent to the active expanding region.

9. A method of manufacturing a multi-channel transistor device, the method comprising;
    forming on a semiconductor substrate an active mask that selectively exposes an active region;
    forming a trench for isolation by selectively etching a portion of the semiconductor substrate that is selectively exposed by the active mask;
    forming a first isolation layer partially filling the trench and exposing a sidewall portion of the trench that corresponds to an upper side portion of the active region;
    forming an active expanding region on the exposed upper side portion of the active region by selective epitaxial growth (SEG);
    forming a second isolation layer that separates adjacent active expanding regions;
    forming an active mask second pattern covering a portion of the active region;
    forming an etch mask by forming an etch mask layer over the active mask second pattern, wherein the etch mask layer and a residual second isolation layer, which is a portion of the second isolation layer that remain unetched, cooperatively operate as the etch mask;
    selectively removing the active mask second pattern using the etch mask;
    selectively etching a portion of the active region that is exposed as a result of removing the active mask second pattern to form a groove that separates channel bars defined in the active expanding region from the active region;
    selectively removing a portion of the first isolation layer that is exposed by the groove and underlies the channel bars such that a sidewall of the groove is recessed and exposes at least the bottom surface portions of the channel bars and removing the etch mask;
    forming a gate dielectric layer on exposed surfaces of the channel bars;
    forming a gate on the gate dielectric layer; and
    forming a source/drain region in a region of the active expanding region adjacent to the gate.

10. The method of claim 9 further comprising recessing a sidewall of the trench such that the active mask overhangs the trench before the forming of the first isolation layer.

11. The method of claim 9 further comprising forming a spacer on the sidewall of the trench.

12. The method of claim 9, wherein the forming of the first isolation layer comprises:
    forming an insulating material layer by filling the trench with an insulating material that has an etching selectivity with respect to the active mask;
    performing chemical mechanical polishing on the insulating material layer until a top surface of the active mask is exposed; and
    selectively etching the polished insulating material layer using the active mask as an etch mask such that the upper side portion of the active region is exposed.

13. The method of claim 12, wherein a thickness of the active expanding region is determined according to the height of the exposed upper side portion of the active region.

14. The method of claim 9, wherein the forming of the active mask second pattern comprises:

forming a dummy gate pattern across the second isolation layer and the active mask; and selectively etching a portion of the active mask and a portion of the second isolation layer that are exposed by the dummy gate pattern such that a surface of the underlying expended active portion is partially exposed.

15. The method of claim 14, wherein the forming of the etch mask comprises:

forming the etch mask layer by depositing an insulating material that has an etching selectivity with respect to the active mask second pattern over the active mask second pattern to fill the etched portion of the second isolation layer; and performing chemical mechanical polishing on the etch mask layer using the active mask second pattern as a polishing end point, wherein the polished etch mask layer and the residual second isolation layer form the etch mask.

16. The method of claim 9 further comprising exposing all sides of the channel bars by selectively removing portions of the second isolation layer that remain on both sides of the channel bars after the selectively removing of the first isolation layer.

17. The method of claim 16, wherein the exposing of all the sides of the channel bars comprises selectively removing the portions of the second isolation layer that remain on both sides of the channel bars using a reverse gate mask pattern as an etch mask.

18. The method of claim 17, wherein the exposing of all the sides of the channel bars comprises:

forming a sacrificial layer shielding an entrance of the groove;

forming the reverse gate mask pattern on the sacrificial layer;

selectively etching away the sacrificial layer and the portions of the second isolation layer using the reverse gate mask pattern as the etch mask; and selectively removing the reverse gate mask pattern.

19. The method of claim 10, wherein the gate surrounds all the exposed sides of the channel bars.

20. The method of claim 9 further comprising annealing the channel bars in a hydrogen-containing atmosphere before the forming of the gate dielectric layer.

* * * * *